US008323874B2

(12) United States Patent
Ray et al.

(10) Patent No.: US 8,323,874 B2
(45) Date of Patent: *Dec. 4, 2012

(54) METHOD OF MAKING LITHOGRAPHIC PRINTING PLATES

(75) Inventors: Kevin B. Ray, Fort Collins, CO (US); Anthony P. Kitson, Greeley, CO (US)

(73) Assignee: Eastman Kodak Company, Rochester, NY (US)

( * ) Notice: Subject to any disclaimer, the term of this patent is extended or adjusted under 35 U.S.C. 154(b) by 616 days.

This patent is subject to a terminal disclaimer.

(21) Appl. No.: 12/017,408

(22) Filed: Jan. 22, 2008

(65) Prior Publication Data

US 2009/0186301 A1 Jul. 23, 2009

(51) Int. Cl.
*G03F 7/00* (2006.01)
*G03F 7/26* (2006.01)
*B41F 7/00* (2006.01)

(52) U.S. Cl. ............... 430/302; 430/309; 101/450.1; 101/453; 101/463.1

(58) Field of Classification Search ............... 430/270.1, 430/302
See application file for complete search history.

(56) References Cited

U.S. PATENT DOCUMENTS

| | | | |
|---|---|---|---|
| 4,786,581 A * | 11/1988 | Stahlhofen et al. ............ 430/331 |
| 5,035,982 A | 7/1991 | Walls | |
| 6,143,464 A | 11/2000 | Kawauchi | |
| 6,649,319 B2 | 11/2003 | Fiebag et al. | |
| 7,163,770 B1 * | 1/2007 | Saraiya et al. ................ 430/15 |
| 7,169,518 B1 | 1/2007 | Savariar-Hauck et al. | |
| 2002/0106583 A1 * | 8/2002 | Kawamura et al. ........ 430/271.1 |
| 2003/0031948 A1 * | 2/2003 | Fiebag et al. ................ 430/165 |
| 2003/0108817 A1 * | 6/2003 | Patel et al. ................ 430/285.1 |
| 2004/0137366 A1 | 7/2004 | Kawauchi | |
| 2005/0238994 A1 * | 10/2005 | Vermeersch et al. ...... 430/270.1 |
| 2005/0266349 A1 | 12/2005 | Van Damme et al. | |
| 2006/0257764 A1 * | 11/2006 | Ray et al. ...................... 430/14 |
| 2008/0118868 A1 * | 5/2008 | Savariar-Hauck et al. ... 430/302 |
| 2009/0142695 A1 * | 6/2009 | Baumann et al. .......... 430/270.1 |

FOREIGN PATENT DOCUMENTS

| | | |
|---|---|---|
| EP | 1 788 429 | 5/2007 |
| EP | 1 788 434 | 5/2007 |
| EP | 1 788 441 | 5/2007 |
| EP | 1 788 442 | 5/2007 |
| EP | 1 788 443 | 5/2007 |
| EP | 1 788 444 | 5/2007 |
| EP | 1 788 450 | 5/2007 |
| EP | 1788 430 | 5/2007 |
| EP | 1788 431 | 5/2007 |
| JP | 2000-330265 | 11/2000 |
| WO | WO 02/14071 A1 | 2/2002 |
| WO | WO 02/101469 A1 | 12/2002 |
| WO | 2005/111727 | 11/2005 |
| WO | 2007/057442 | 5/2007 |
| WO | 2007/060200 | 5/2007 |

OTHER PUBLICATIONS

U.S. Appl. No. 11/949,814, filed Dec. 4, 2007 titled Methods of Using Violet-Sensitive Imageable Elements by Kevin B. Ray et al.
U.S. Appl. No. 11/872,772, filed Oct. 16, 2007 titled Methods for Imaging and Processing Negative-Working Imageable Elements by Kevin B. Ray et al.

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

A multi-layer, positive-working lithographic printing plate precursor can be imaged with infrared radiation and processed in a single step using a single processing solution that has a pH greater than 6 and up to about 11. This single processing solution both develops the imaged precursor and provides a protective coating that need not be rinsed off before lithographic printing.

18 Claims, No Drawings

METHOD OF MAKING LITHOGRAPHIC PRINTING PLATES

FIELD OF THE INVENTION

This invention provides a method for preparing lithographic printing plates using a single processing solution after imaging, which processing solution both develops and protects the imaged surface of the printing plates before their use in lithographic printing.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise at least one imageable layer applied over the hydrophilic surface of a substrate. The imageable layer(s) include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged (exposed) regions are removed, the element is considered as positive-working. Conversely, if the non-imaged (non-exposed) regions are removed, the element is considered as negative-working. In each instance, the regions of the imageable layer (that is, the image areas) that remain are ink-receptive, and the regions of the hydrophilic surface revealed by the developing process accept water or a fountain solution and repel ink.

Direct digital imaging has become increasingly important in the printing industry. Imageable elements for the preparation of lithographic printing plates have been developed for use with infrared lasers. Thermally imageable, multi-layer positive-working elements are described, for example, in U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), and U.S. Pat. No. 6,528,228 (Savariar-Hauck et al.), and U.S. Patent Application Publication 2004/0067432 A1 (Kitson et al.). U.S. Patent Application Publication 2005/0037280 (Loccufier et al.) describes heat-sensitive printing plate precursors that comprise a phenolic developer-soluble polymer and an infrared radiation absorbing agent in the same layer.

Additional positive-working thermally imageable elements are described and used for making lithographic printing plates using various developers in U.S. Pat. No. 6,200,727 (Urano et al.), U.S. Pat. No. 6,358,669 (Savariar-Hauck et al), and U.S. Pat. No. 6,534,238 (Savariar-Hauck et al.). In some instances, such imageable elements are developed using low pH developers when the upper layer includes novolak resins and dissolution suppressing agents.

Single-layer, positive-working imageable elements are described for example, in U.S. Pat. No. 6,280,899 (Hoare et al.), U.S. Pat. No. 6,391,524 (Yates et al.), U.S. Pat. No. 6,485,890 (Hoare et al.), U.S. Pat. No. 6,558,869 (Hearson et al.), and U.S. Pat. No. 6,706,466 (Parsons et al.), and U.S. Patent Application Publication 2006/0130689 (Müller et al.).

Copending and commonly assigned, U.S. Ser. No. 11/686,981 (filed Mar. 16, 2006 by Savariar-Hauck et al.) describes and claims a method of processing positive-working imageable elements to prepare lithographic printing plates. Other imageable elements are described in U.S. Pat. No. 6,555,291 (Savariar-Hauck).

Development of negative-working elements using gums is described for example, in EP Publications 1,751,625 (Van Damme et al. published as WO 2005/111727) U.S. Pat. No. 1,788,429 (Loccufier et al. et al.), U.S. Pat. No. 1,788,430 (Williamson et al.), U.S. Pat. No. 1,788,431 (Van Damme et al.), U.S. Pat. No. 1,788,434 (Van Damme et al.), U.S. Pat. No. 1,788,441 (Van Damme), U.S. Pat. NO. 1,788,442 (Van Damme), U.S. Pat. No. 1,788,443 (Van Damme), U.S. Pat. No. 1,788,444 (Van Damme), and U.S. Pat. No. 1,788,450 (Van Damme), and WO 2007/057442 (Gries et al.). In addition, copending and commonly assigned U.S. Ser. No. 11/872,772 that was filed Oct. 16, 2007 by K. Ray, Tao, Miller, Clark, and Roth) describes negative-working imageable elements that are sensitive to infrared radiation and can be processed using gum solutions.

Copending and commonly assigned U.S. Ser. No. 11/947,817 (filed Dec. 4, 2007 by K. Ray, Tao, and Clark) describes the use of gums to develop imaged UV-sensitive, negative-working imageable elements that contain specific nonpolymeric diamide additives.

Problem to be Solved

There is a fundamental difference between the imaged regions in negative-working and positive-working imageable elements. In negative-working imageable elements, the exposed (imaged) coating regions are crosslinked or coalesced and are generally insoluble in processing fluids. However, the non-exposed coating(s) regions remaining in positive-working imageable elements can be removed if a processing solution is left on it for an extended period of time. This fundamental difference between the chemistries used in the two types of coatings is particularly evident when the positive-working imageable elements are composed of IR-sensitive chemistries rather than the older naphthoquinonediazide chemistry. The difference in rate of dissolution between exposed and non-exposed IR-sensitive coatings is relatively small. Thus, a user needs to develop or process such coatings and remove residual processing solution as soon as possible.

While known positive-working imageable elements have been commercialized to great success, they are generally processed (developed) using various high alkaline developers. A separate finishing gum is normally applied to the developed image to protect the plate during handling. There is a desire to process such elements in a simplified process using more environmentally acceptable processing solutions without the loss in the desired imaging properties. While negative-working imageable elements have been processed with gum solutions, until now, it was not expected that imaged positive-working imageable elements, containing very different chemistries and multiple layers, could be similarly processed and protected before printing because of the fundamental differences in imaging chemistries noted above.

SUMMARY OF THE INVENTION

This invention provides a method for making an image comprising:

A) imagewise exposing a positive-working lithographic printing plate precursor using infrared radiation to provide both exposed and non-exposed regions in the imaged precursor, the positive-working lithographic printing plate precursor comprising a substrate having thereon, in order:

an inner layer comprising a first polymeric binder, and an ink receptive outer layer comprising a second polymeric binder that is different than the first polymeric binder, the lithographic printing plate precursor further comprising an infrared radiation absorbing compound, and B) applying a single processing solution having a pH of from about 6 to about 11 to the imaged precursor both: (1) to remove predominantly only the exposed regions, and (2) to provide a protective coating over all of the exposed and non-exposed regions of the resulting lithographic printing plate.

This invention also provides a method of lithographic printing comprising:

A) imagewise exposing a positive-working lithographic printing plate precursor using infrared radiation to provide both exposed and non-exposed regions in the imaged precursor, the positive-working lithographic printing plate precursor comprising a substrate having thereon, in order:

an inner layer comprising a first polymeric binder, and an ink receptive outer layer comprising a second polymeric binder that is different than the first polymeric binder, the positive-working lithographic printing plate precursor further comprising an infrared radiation absorbing compound, B) applying a single processing solution having a pH of from about 6 to about 11 to the imaged precursor both: (1) to remove predominantly only the exposed regions, and (2) to provide a protective coating over all of the exposed and non-exposed regions of the resulting lithographic printing plate, C) removing excess processing solution from the lithographic printing plate (for example, using a squeegee), and optionally drying the lithographic printing plate, and D) without removing the protective coating, using the lithographic printing plate for printing an image using a lithographic printing ink.

The lithographic printing plates prepared according to this invention can be used right away for lithographic printing after processing. This simpler and essentially one-step processing procedure provides advantages in work-flow and productivity in preparing the printing plates for use in the pressroom. The single processing step of the invention replaces the traditionally separate development and gumming steps. In addition, the single processing solution is less harmful to the environment and easier to handle and less toxic for disposal. All of these advantages further reduce costs of processing as well.

DETAILED DESCRIPTION OF THE INVENTION

Definitions

Unless the context indicates otherwise, when used herein, the terms "imageable element", "positive-working imageable element", and "lithographic printing plate precursor" are meant to be references to embodiments useful in the practice of the present invention.

In addition, unless the context indicates otherwise, the various components described herein such as "first polymeric binder", "second polymeric binder", "additional polymeric binder", "anionic surfactant", "radiation absorbing compound", "IR dye", and similar terms also refer to mixtures of such components. Thus, the use of the article "a" or "an" is not necessarily meant to refer to only a single component.

By "multilayer" imageable element, we mean an imageable element such as a lithographic printing plate that has at least two imageable layers required for providing an image, for example, "inner" and "outer" layers as described below. However, such elements may comprise additional non-imaging layers on either side of the substrate.

By the term "remove predominantly only said exposed regions" during development, we mean that the exposed regions of the outer layer and the corresponding regions of any underlying layers are selectively and preferentially removed by the processing solution, but not the non-exposed regions to any significant extent (there may be insubstantial removal of the non-exposed regions).

By "computer-to-press", we mean the imaging means is carried out using a computer-directed imaging means (such as a laser) directly to the imageable layers without using masking or other intermediate imaging films.

Unless otherwise indicated, the term "single processing solution" is meant to refer to the slightly acidic to slightly alkaline solutions described herein that are used to carry out the processing step B) of the methods of this invention.

Unless otherwise indicated, percentages refer to percents by dry weight, either the dry solids of a layer composition or formulation, or the dry coated weight of a layer (for example, inner, outer, or intermediate layer). Unless otherwise indicated, the weight percent values can be interpreted as for either a layer formulation or a dried layer coating.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The method of this invention is used primarily to provide lithographic printing plates that can be used in lithographic printing operations as described in more detail below.

In general, the lithographic printing plate precursors comprise a substrate, an inner layer (also known in the art as an "underlayer"), and an outer layer (also known in the art as a "top layer" or "topcoat") disposed over the inner layer. Before thermal (or infrared) imaging, the outer layer is generally insoluble or non-removable by a processing solution (as defined below) within the usual time allotted for development, but after thermal imaging, the exposed regions of the outer layer are soluble in the processing solution. The inner layer is also generally removable by the processing solution. An infrared radiation absorbing compound (described above) can also be present, typically only in the inner layer but it may optionally be present only or additionally in a separate layer between the inner and outer layers. However, in other embodiments, the radiation absorbing compound may be in the outer layer only, or in both the outer and inner layers, as described for example in EP 1,439,058A2 (Watanabe et al.) and EP 1,738,901A1 (Lingier et al.), or in an intermediate layer as described.

Substrate

The lithographic printing plate precursors are formed by suitable application of an inner layer composition onto a suitable substrate. This substrate can be an untreated or uncoated support but it is usually treated or coated in various ways as described below to provide a highly hydrophilic surface prior to application of the inner layer composition. The substrate comprises a support that can be composed of any material that is conventionally used to prepare lithographic printing plate precursors. The substrate can be treated to provide an "interlayer" for improved adhesion or hydrophilicity, and the inner layer formulation is applied over the interlayer.

The substrate is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A useful substrate is composed of an aluminum-containing support that may be coated or treated using techniques known in the art, including physical graining, electrochemical graining, chemical graining, and anodizing. For example, the aluminum sheet can be anodized using phosphonic acid or sulfuric acid using conventional procedures.

An optional interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid-acrylic acid copolymer, poly(acrylic acid), or (meth)acrylic acid copolymer, or mixtures thereof. For example, the grained and/or anodized aluminum support can be treated with poly(phosphonic acid) using known procedures to improve surface hydrophilicity to provide a lithographic hydrophilic substrate.

The thickness of the substrate can be varied but should be sufficient to sustain the wear from printing and thin enough to wrap around a printing form. Such embodiments typically include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the imageable layers applied thereon, and thus be an integral part of the printing press or a sleeve that is incorporated onto a press cylinder. The use of such imaged cylinders is described for example in U.S. Pat. No. 5,713,287 (Gelbart).

The lithographic printing plate precursor also includes one or more infrared radiation absorbing compounds ("IR absorbing compounds") that absorb radiation from about 600 to about 1200 nm and typically from about 700 to about 1200 nm with minimal absorption at 300 to 600 nm.

Examples of suitable IR dyes include but are not limited to, azo dyes, squarylium dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S Patent Application Publication 2005-0130059 (Tao). A general description of one class of suitable cyanine dyes is shown by the formula in paragraph 0026 of WO 2004/101280 (Munnelly et al.).

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. NO. 6,153,356 (Urano et al.), and U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The infrared radiation absorbing compound is generally present in the lithographic printing plate precursor in an amount of at least 0.5% and up to 30 weight % and typically from about 3 to about 25 weight % (based on total dry layer weight). The particular amount needed for this purpose would be readily apparent to one skilled in the art, depending upon the specific compound used and the properties of the alkaline developer to be used. In most embodiments, the IR radiation absorbing compound is present in the inner layer only, but as noted above, optionally it can be in other locations in addition to or alternatively to, the inner layer.

Inner layer

The inner layer is disposed between the outer layer and the substrate. Typically, it is disposed directly on the substrate (including any hydrophilic coatings as described above). The inner layer comprises a first polymeric binder that is removable by the gum and typically soluble in the gum to reduce sludging in the processor. In addition, the first polymeric binder is usually insoluble in the solvent used to coat the outer layer so that the outer layer can be coated over the inner layer without dissolving the inner layer. Mixtures of these first polymeric binders can be used if desired in the inner layer.

Useful first polymeric binders for the inner layer include (meth)acrylonitrile polymers (derived at least in part from a (meth)acrylonitrile), (meth)acrylic resins comprising carboxy groups, polyvinyl acetals, maleated wood rosins, a vinyl acetate-crotonate-vinyl neodecanoate copolymer, a phenolic resin, styrene-maleic anhydride copolymers, (meth)acrylamide polymers (derived at least in part from a (meth)acrylamide) including polymers derived at least in part from an N-alkoxyalkyl methacrylamide, polymers derived at least in part from a (meth)acrylate having pendant hydroxy groups, polymers derived at least in part from an N-substituted cyclic imide, polymers having pendant cyclic urea groups, a polymer derived at least in part from styrene or a styrene derivative, a polymer derived at least in part from a phosphate (meth)acrylate ester, a copolymer derived from an N-substituted cyclic imide, a (meth)acrylonitrile, a (meth)acrylamide, and (meth)acrylic acid. Various combinations of these polymers can also be used.

More specifically, useful first polymeric binders include (meth)acrylonitrile polymers, and copolymers derived from a combination of at least one N-substituted cyclic imide (especially N-phenylmaleimide), a (meth)acrylamide (especially methacrylamide), a monomer having a pendant cyclic urea group, and a (meth)acrylic acid (especially methacrylic acid). First polymeric binders of this type include copolymers that comprise from about 20 to about 75 mol % and typically about 35 to about 60 mol % or recurring units derived from N-phenylmaleimide, N-cyclohexyl-maleimide, N-(4-carboxyphenyl)maleimide, N-benzylmaleimide, or a mixture thereof, from about 10 to about 50 mol % and typically from about 15 to about 40 mol % of recurring units derived from acrylamide, methacrylamide, or a mixture thereof, and from about 5 to about 30 mol % and typically about 10 to about 30 mol % of recurring units derived from methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid. Optionally, these polymers can also include recurring units derived from (meth)acrylonitrile or N-[2-(2-oxo-1-imidazolidinyl)ethyl]-methacrylamide.

The bakeable inner layers described in WO 2005/018934 (Kitson et al.) and U.S. Pat. No. 6,893,783 (Kitson et al.) may also be used.

For example, useful first polymeric binders can comprise, in polymerized form, from about 5 mol % to about 30 mol % (typically from about 10 mol % to about 30 mol % of recurring units) derived from an ethylenically unsaturated polymerizable monomer having a carboxy group (such as acrylic acid, methacrylic acid, itaconic acid, and other similar monomers known in the art (acrylic acid and methacrylic acid are preferred), from about 20 mol % to about 75 mol % (typically from about 35 mol % to about 60 mol %) of recurring units derived from N-phenylmaleimide, N-cyclohexylmaleimide, or a mixture thereof, optionally, from about 5 mol % to about 50 mol % (typically when present from about 15 mol % to about 40 mol %) of recurring units derived from methacrylamide, and from about 3 mol % to about 50 mol % (typically from about 10 mol % to about 40 mol % of one or more recurring units derived from monomer compounds of the following Structure (IV):

$$CH_2=C(R_2)-C(=O)-NH-CH_2-OR_1 \qquad (IV)$$

wherein $R_1$ is a $C_1$ to $C_{12}$ alkyl, phenyl, $C_1$ to $C_{12}$ substituted phenyl, $C_1$ to $C_{12}$ aralkyl, or $Si(CH_3)_3$, and $R_2$ is hydrogen or methyl. Methods of preparation of certain of these polymeric materials are disclosed in U.S. Pat. No. 6,475,692 (Jarek).

The first polymeric binder useful in the inner layer can also be hydroxy-containing polymeric material composed of recurring units derived from two or more ethylenically unsaturated monomers wherein from about 1 to about 50 mol % (typically from about 10 to about 40 mol %) of the recurring units are derived from on or more of the monomers represented by the following Structure (V):

$$CH_2=C(R_3)C(=O)NR_4(CR_5R_6)_mOH \qquad (V)$$

wherein $R_3$, $R_4$, $R_5$, $R_6$ are independently hydrogen, substituted or unsubstituted lower alkyl having 1 to 10 carbon atoms (such as methyl, chloromethyl, ethyl, iso-propyl, t-butyl, and n-decyl), or substituted or unsubstituted phenyl, and m is 1 to 20.

Some embodiments of hydroxy-containing first polymeric binders can be represented by the following Structure (VI):

$$-(A)_x-(B)_y-(C)_z- \qquad (VI)$$

wherein A represents recurring units represented by the following Structure (VI-A):

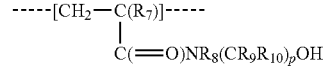

$$-----[CH_2-C(R_7)]----- \atop C(=O)NR_8(CR_9R_{10})_pOH \qquad (VI-A)$$

wherein $R_7$ through $R_{10}$ and p are as defined the same as $R_3$ through $R_6$ and m noted above for Structure (V).

In Structure (VI), B represents recurring units comprising acidic functionality or an N-maleimide group, and C represents recurring units different from A and B, x is from about 1 to about 50 mol % (typically from about 10 to about 40 mol %), y is from about 40 to about 90 mol % (typically from about 40 to about 70 mol %), and z is 0 to about 70 mol % (typically from 0 to about 50 mol %), based on total recurring units.

In some embodiments of Structure (VI):

A represents recurring units derived from one or both of N-hydroxymethyl acrylamide and N-hydroxymethyl methacrylamide, B represents recurring units derived from one or more of N-phenylmaleimide, N-cyclohexylmaleimide, N-benzylmaleimide, N-(4-carboxyphenyl)maleimide, (meth)acrylic acid, and vinyl benzoic acid, C represents recurring units derived from one or more of a styrenic monomer (such as styrene and derivatives thereof), meth(acrylate) ester, N-substituted (meth)acrylamide, maleic anhydride, (meth)acrylonitrile, allyl acrylate, and a compound represented by the following Structure (VI-C):

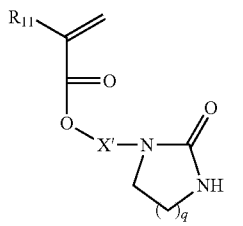

(VI-C)

wherein $R_{11}$ is hydrogen, methyl, or halo, X' is alkylene having 2 to 12 carbon atoms, q is 1 to 3, x is from about 10 to 40 mol %, y is from about 40 to about 70 mol %, and z is from 0 to about 50 mol %, all based on total recurring units.

In some embodiments for Structure VI, B represents recurring units derived from at least one of N-phenylmaleimide, N-cyclohexylmaleimide, N-benzylmaleimide, N-(4-carboxyphenyl)maleimide in an amount of from about 20 to about 50 mol %, and recurring units derived from at least one of (meth)acrylic acid and vinyl benzoic acid in an amount of from about 10 to about 30 mol %, based on total recurring units.

In such embodiments, C represents recurring units derived from methacrylamide, (meth)acrylonitrile, maleic anhydride, or

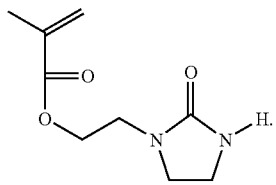

Still other useful first polymeric binders are addition or condensation polymers having a polymer backbone to which are attached pendant phosphoric acid groups (for example, derived from phosphate (meth)acrylate esters), pendant adamantyl groups, or both types of pendant groups. The pendant adamantyl groups are connected to the polymer backbone at least through a urea or urethane linking group but other linking groups can also be present. Useful first polymeric binders of this type are described in U.S. Pat. No. 7,247,418 (Saraiya et al.) that is incorporated herein by reference.

In referring to "phosphoric acid" groups, it is also intended to include the corresponding salts of the phosphoric acid, including but not limited to, alkali metal salts and ammonium salts. Any suitable positive counterion can be used with the pendant phosphoric acid groups as long as the counterion does not adversely affect the performance of the resulting polymer or other desired imaging properties.

Still other useful first polymeric binders comprise a backbone and have attached to the backbone the following Structure Q group:

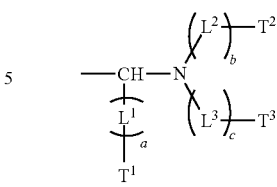

(Q)

wherein $L^1$, $L^2$, and $L^3$ independently represent linking groups, $T^1$, $T^2$, and $T^3$ independently represent terminal groups, and a, b, and c are independently 0 or 1.

More particularly, each of $L^1$, $L^2$, and $L^3$ is independently a substituted or unsubstituted alkylene having 1 to 4 carbon atoms (such as methylene, 1,2-ethylene, 1,1-ethylene, n-propylene, iso-propylene, t-butylene, and n-butylene groups), substituted cycloalkylene having 5 to 7 carbon atoms in the cyclic ring (such as cyclopentylene and 1,4-cyclohexylene), substituted or unsubstituted arylene having 6 to 10 carbon atoms in the aromatic ring (such as 1,4-phenylene, naphthylene, 2-methyl-1,4-phenylene, and 4-chloro-1,3-phenylene groups), or substituted or unsubstituted, aromatic or non-aromatic divalent heterocyclic group having 5 to 10 carbon and one or more heteroatoms in the cyclic ring (such as pyridylene, pyrazylene, pyrimidylene, or thiazolylene groups), or any combinations of two or more of these divalent linking groups. Alternatively, $L^2$ and $L^3$ together can represent the necessary atoms to form a carbocyclic or heterocyclic ring structure. For example, $L^1$ can be a carbon-hydrogen single bond or a methylene, ethylene, or phenylene group, and $L^2$ and $L^3$ are independently hydrogen, methyl, ethyl, 2-hydroxyethyl, or cyclic —$(CH_2)_2O(CH_2CH_2)$— groups.

$T^1$, $T^2$, and $T^3$ are independently terminal groups such as hydrogen, or substituted or unsubstituted alkyl groups having 1 to 10 carbon atoms (such as methyl, ethyl, iso-propyl, t-butyl, n-hexyl, methoxymethyl, phenylmethyl, hydroxyethyl, and chloroethyl groups), substituted or unsubstituted alkenyl groups having 2 to 10 carbon atoms (such as ethenyl and hexenyl groups), substituted or unsubstituted alkynyl groups (such as ethynyl and octynyl groups), substituted or unsubstituted cycloalkyl groups having 5 to 7 carbon atoms in the cyclic ring (such as cyclopentyl, cyclohexyl, and cycloheptyl groups), substituted or unsubstituted heterocyclic groups (both aromatic and non-aromatic) having a carbon atom and one or more heteroatoms in the ring (such as pyridyl, pyrazyl, pyrimidyl, thiazolyl, and indolyl groups), and substituted or unsubstituted aryl groups having 6 to 10 carbon atoms in the aromatic ring (such as phenyl, naphthyl, 3-methoxyphenyl, benzyl, and 4-bromophenyl groups). Alternatively, $T^2$ and $T^3$ together represent the atoms necessary to form a cyclic structure that can also contain fused rings. In addition, when "a" is 0, $T^3$ is not hydrogen.

In some embodiments, the Structure Q group can be directly attached to an α-carbon atom in the polymer backbone, the α-carbon atom also having attached thereto an electron withdrawing group. In other embodiments, the Structure Q group is indirectly attached to the polymer backbone through a linking group.

These first polymeric binders can be prepared by the reaction of an α-hydrogen in the polymer precursor with a first compound comprising an aldehyde group and a second compound comprising an amine group as described in U.S. Patent Application Publication 2005/0037280 (Loccufier et al.).

The first polymeric binders can also be represented by the following Structure (X):

$$-(A)_x-(B)_y-\quad(X)$$

wherein A represents recurring units derived from one or more ethylenically unsaturated polymerizable monomers that comprise the same or different Q groups, B represents recurring units derived from one or more different ethylenically unsaturated polymerizable monomers that do not comprise Q groups.

More particularly, the A recurring units in Structure X can be represented by the following Structure (Xa) or (Xb):

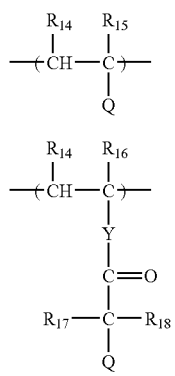

wherein $R_{14}$ and $R_{16}$ are independently hydrogen or a halo, substituted or unsubstituted alkyl having 1 to 7 carbon atoms (such as methyl, ethyl, n-propyl, iso-propyl, or benzyl), or a substituted or unsubstituted phenyl group. For example, $R_{14}$ and $R_{16}$ can be independently hydrogen or a methyl or halo group, and preferably they are independently hydrogen or methyl.

$R_{15}$ in Structure Xa is an electron withdrawing group as defined above including but are not limited to, cyano, nitro, substituted or unsubstituted aryl groups having 6 to 10 carbon atoms in the carbocyclic ring, substituted or unsubstituted heteroaryl groups having 5 to 10 carbon, sulfur, oxygen, or nitrogen atoms in the heteroaromatic ring, —C(=O)OR$_{20}$, and —C(=O)R$_{20}$ groups wherein R$_{20}$ is hydrogen or a substituted or unsubstituted alkyl having 1 to 4 carbon atoms (such as methyl, ethyl, n-propyl, t-butyl), a substituted or unsubstituted cycloalkyl (such as a substituted or unsubstituted cyclohexyl), or a substituted or unsubstituted aryl group (such as substituted or unsubstituted phenyl). The cyano, nitro, —C(=O)OR$_{20}$, and —C(=O)R$_{20}$ groups are useful and cyano, —C(=O)CH$_3$, and —C(=O)OCH$_3$ are more useful.

$R_{17}$ and $R_{18}$ in Structure (Xb) are independently hydrogen or a substituted or unsubstituted alkyl group having 1 to 6 carbon atoms (such as such as methyl, ethyl, n-propyl, t-butyl, n-hexyl), substituted or unsubstituted cycloalkyl having 5 or 6 carbon atoms (such as cyclohexyl), a substituted or unsubstituted aryl group having 6 to 10 carbon atoms (such as phenyl, 4-methylphenyl, and naphthyl), or a —C(=O)R$_{19}$ group wherein $R_{19}$ is a substituted or unsubstituted alkyl group (as defined for $R_{17}$ and $R_{18}$), a substituted or unsubstituted alkenyl group having 2 to 8 carbon atoms (such as ethenyl and 1,2-propenyl), a substituted or unsubstituted cycloalkyl group (as defined above for $R_{17}$ and $R_{18}$), or a substituted or unsubstituted aryl group (as defined above for $R_{17}$ and $R_{18}$). Preferably, $R_{17}$ and $R_{18}$ are independently hydrogen or a substituted or unsubstituted alkyl, cycloalkyl, aryl, or —C(=O)R$_{19}$ groups as defined above wherein $R_{19}$ is an alkyl having 1 to 4 carbon atoms.

In Structure (Xb), Y is a direct bond or a divalent linking group. Useful divalent linking groups include but are not limited to oxy, thio, —NR$_{21}$—, substituted or unsubstituted alkylene, substituted or unsubstituted phenylene, substituted or unsubstituted heterocyclylene, —C(=O)—, and —C(=O)O— groups, or a combination thereof wherein R$_{21}$ is hydrogen or a substituted or unsubstituted alkyl, substituted or unsubstituted cycloalkyl, or substituted or unsubstituted aryl group, as defined above for $R_{17}$ and $R_{18}$. For example, Y is a direct bond or an oxy, —C(=O)O—, —C(=O)OCH$_2$CH$_2$O—, or —C(=O)CH$_2$CH$_2$OC(=O)CH$_2$— group.

In Structure (X), x is from about 1 to about 70 mol %, and y is from about 30 to about 99 mol %, based on total recurring units. More typically, x is from about 5 to about 50 mol % and y is from about 50 to about 95 mol %, based on total recurring units.

Also in Structure (X), B can represent recurring units derived from a wide variety of ethylenically unsaturated polymerizable monomers. Particularly useful recurring units are derived from one or more N-substituted maleimides, N-substituted (meth)acrylamides, unsubstituted (meth)acrylamides, (meth)acrylonitriles, or vinyl monomers having an acidic group, and more preferably from one or more N-phenylmaleimides, N-cyclohexylmaleimides, N-benzylmaleimides, N-(4-carboxyphenyl)maleimides, (meth)acrylic acids, vinyl benzoic acids, (meth)acrylamides, and (meth)acrylonitriles. Several of these monomers can be copolymerized to provide multiple types of B recurring units. Useful combinations of B recurring units include those derived from two or more of methacrylic acid, methacrylamide, and N-phenylmaleimide.

The first polymeric binders are the predominant polymeric materials in the inner layer. That is, they comprise more than 50% and up to 100% (dry weight) of the total polymeric materials in the inner layer. However, the inner layer may also comprise one or more primary additional polymeric materials, provided these primary additional polymeric materials do not adversely affect the chemical resistance and solubility properties of the inner layer.

Useful primary additional polymeric materials include copolymers that comprises from about 1 to about 30 mole % of recurring units derived from N-phenylmaleimide, from about 1 to about 30 mole % of recurring units derived from methacrylamide, from about 20 to about 75 mole % of recurring units derived from acrylonitrile, and from about 20 to about 75 mole % of recurring units derived from one or more monomers of the Structure (XI):

$$CH_2=C(R_{23})-CO_2-CH_2CH_2-NH-CO-NH-p-C_6H_4-R_{22}\quad(XI)$$

wherein $R_{22}$ is OH, COOH, or SO$_2$NH$_2$, and $R_{23}$ is H or methyl, and, optionally, from about 1 to about 30 mole % from about 3 to about 20 mole % of recurring units derived from one or more monomers of the Structure (XII):

$$CH_2=C(R_{25})-CO-NH-p-C_6H_4-R_{24}\quad(XII)$$

wherein $R_{24}$ is OH, COOH, or SO$_2$NH$_2$, and $R_{25}$ is H or methyl.

The inner layer may also comprise one or more secondary additional polymeric materials that are resins having activated methylol and/or activated alkylated methylol groups. These "secondary additional polymeric materials" in the inner layer should not be confused with the "second polymeric binder" used in the outer layer.

The secondary additional polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

Useful secondary additional polymeric materials can also include copolymers that comprise from about 25 to about 75 mole % of recurring units derived from N-phenylmaleimide, from about 10 to about 50 mole % of recurring units derived from methacrylamide, and from about 5 to about 30 mole % of recurring units derived from methacrylic acid. These secondary additional copolymers are disclosed in U.S. Pat. Nos. 6,294,311 and 6,528,228 (both noted above).

The first polymeric binder and the primary and secondary additional polymeric materials useful in the inner layer can be purchased from several commercial sources or prepared by methods, such as free radical polymerization, that are well known to those skilled in the art and that are described, for example, in Chapters 20 and 21, of *Macromolecules*, Vol. 2, 2nd Ed., H. G. Elias, Plenum, New York, 1984. The first polymeric binders described above generally comprise at least 50 weight % and typically from about 60 to about 90 weight % and this amount can be varied depending upon what other polymers and chemical components are present. Any primary and secondary additional polymeric materials (such as a novolak, resole, or copolymers noted above) can be present in an amount of from about 5 to about 45 weight %.

The inner layer can also include other components such as surfactants, dispersing aids, humectants, biocides, viscosity builders, drying agents, defoamers, preservatives, antioxidants, and colorants.

The inner layer generally has a dry coating coverage of from about 0.5 to about 2.5 g/m² and typically from about 1 to about 2 g/m².

Outer Layer

The outer layer of the lithographic printing plate precursor is disposed over the inner layer and in most embodiments there are no intermediate layers between the inner and outer layers. The outer layer is usually substantially free of infrared radiation absorbing compounds, meaning that none of these compounds are purposely incorporated therein and insubstantial amounts diffuse into it from other layers.

The one or more second polymeric binders are present in the outer layer at a dry coverage of from about 15 to 100 weight %, typically from about 70 to about 98 weight %.

The second polymeric binders used in the outer layer are generally insoluble in the gum (defined below) prior to infrared radiation exposure and soluble in that gum after such thermal exposure. The second polymeric binders can be chosen at least from one or more of the following seven classes of polymers:

a) novolak resins, resole resins, branched or unbranched polyhydroxystyrenes (or polyvinyl phenols), polyvinyl acetals with pendant phenol groups, and any combination thereof, b) polymers having recurring units derived from one or more monomers of group (a) that is selected from the group consisting norbornene, tetracyclododecene, and mixtures thereof, and recurring units derived from one or more monomers of group (b) that is selected from the group consisting of maleic anhydride, maleimide, N-phenyl maleimide, N-benzyl maleimide, N-cyclohexyl maleimide, and mixtures thereof, c) copolymers derived from maleic anhydride and monomers of the formula $CH_2=CH(C_6H_4R^1)$ and mixtures thereof in which $R^1$ is hydrogen, halogen, hydroxyl, cyano, sulfonamide, alkyl of 1 to 6 carbon atoms, alkoxyl of 1 to 6 carbon atoms, acyl of 1 to 7 carbon atoms, acyloxy of 1 to 7 carbon atoms, carboalkoxy of 1 to 7 carbon atoms, or a mixture thereof, d) copolymers derived from methyl methacrylate and a carboxylic acid containing monomer or a mixture of carboxylic acid containing monomers, e) polymers having an $-X-C(=T)-NR-S(=O)_2-$ moiety that is attached to the polymer backbone, wherein $-X-$ is an oxy or $-NR'-$ group, T is O or S, R and R' are independently hydrogen, halo, or an alkyl group having 1 to 6 carbon atoms, and f) polymers having recurring units represented by the following Structure (I-F) or (II-F):

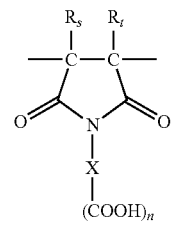

(I-F)

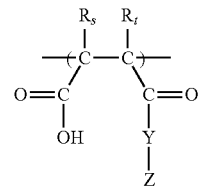

(II-F)

wherein n is 1 to 3, $R_s$ and $R_t$ are independently hydrogen or an alkyl or halo group, X is a multivalent linking group, Y is oxy or $-NR-$ wherein R is hydrogen or an alkyl or aryl group, and Z is a monovalent organic group.

Class a) Polymers:

Examples of Class a) polymers include but are not limited to, poly(hydroxystyrenes), novolak resins, resole resins, poly(vinyl acetals) having pendant phenolic groups, and mixtures of any of these resins (such as mixtures of one or more novolak resins and one or more resole resins). The novolak resins are most preferred.

Generally, such resins have a number average molecular weight of at least 3,000 and up to 200,000, and typically from about 6,000 to about 100,000, as determined using conventional procedures. Most of these types of resins are commercially available or prepared using known reactants and procedures. For example, the novolak resins can be prepared by the condensation reaction of a phenol with an aldehyde in the presence of an acid catalyst. Typical novolak resins include but are not limited to, phenol-formaldehyde resins, cresol-formaldehyde resins, phenol-cresol-formaldehyde resins, p-t-butylphenol-formaldehyde resins, and pyrogallol-acetone resins, such as novolak resins prepared from reacting m-cresol or a m,p-cresol mixture with formaldehyde using conventional conditions. For example, some useful novolak resins include but are not limited to, xylenol-cresol resins, for example, SPN400, SPN420, SPN460, and VPN1100 (that are available from AZ Electronics) and EP25D40G and EP25D50G that have higher molecular weights, such as at least 4,000.

Other useful Class a) resins include polyvinyl compounds having phenolic hydroxyl groups, such as poly(hydroxystyrenes) and copolymers containing recurring units of a hydroxystyrene and polymers and copolymers containing recurring units of substituted hydroxystyrenes.

Also useful are branched poly(hydroxystyrenes) having multiple branched hydroxystyrene recurring units derived from 4-hydroxystyrene as described for example in U.S. Pat. No. 5,554,719 (Sounik) and U.S. Pat. No. 6,551,738 (Ohsawa et al.), and U.S. Published Patent Applications 2003/0050191 (Bhatt et al.) and 2005/0051053 (Wisnudel et al.), and in copending and commonly assigned U.S. patent application Ser. No. 11/474,020 (filed Jun. 23, 2006 by Levanon et al.), that is incorporated herein by reference. For example, such branched hydroxystyrene polymers comprise recurring units derived from a hydroxystyrene, such as from 4-hydroxystyrene, which recurring units are further substituted with repeating hydroxystyrene units (such as 4-hydroxystyrene units) positioned ortho to the hydroxy group. These branched polymers can have a weight average molecular weight ($M_W$) of from about 1,000 to about 30,000, typically from about 1,000 to about 10,000, or from about 3,000 to about 7,000. In addition, they may have a polydispersity less than 2 and typically from about 1.5 to about 1.9. The branched poly(hydroxystyrenes) can be homopolymers or copolymers with non-branched hydroxystyrene recurring units.

Some useful poly(hydroxystyrenes) are described in EP 1,669,803A (Barclay et al.).

Other useful polymeric binders are modified novolak or resole resins that are represented in the following Structure (POLYMER):

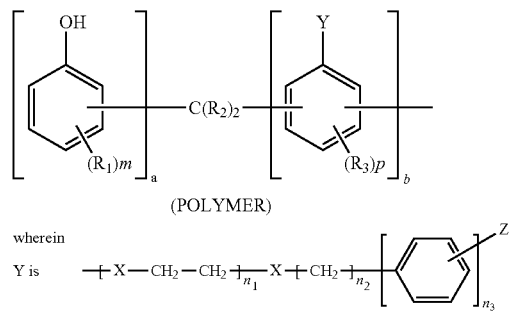

(POLYMER)

wherein Y is

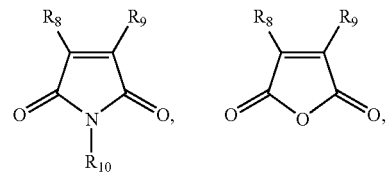

a is from about 90 to about 99 mol % (typically from about 92 to about 98 mol %), b is from about 1 to about 10 mol % (typically from about 2 to about 8 mol %), $R_1$ and $R_3$ are independently hydrogen or hydroxy, alkyl, or alkoxy groups, $R_2$ is hydrogen or an alkyl group, X is an alkylene, oxy, thio, —OC(=O)Ar—, —OC(=O)CH=CH—, or —OCO(CH$_2$)$_{n4}$— group wherein Ar is an aryl group, m and p are independently 1 or 2, $n_1$ is 0 or an integer up to 5 (for example 0, 1, 2, or 3), $n_2$ is 0 or an integer up to 5 (for example, 0, 1, or 2), $n_3$ is 0 or 1 (typically 0), $n_4$ is at least 1 (for example, up to 8), and Z is —C(=O)OH, —S(=O)$_2$OH, —P(=O)(OH)$_2$, or —OP(=O)(OH)$_2$.

The alkyl and alkoxy groups present in the polymeric binders (for $R^1$, $R^2$, and $R^3$) can be unsubstituted or substituted with one or more halo, nitro, or alkoxy groups, and can have 1 to 3 carbon atoms. Such groups can be linear, branched, or cyclic (that is, "alkyl" also include "cycloalkyl" for purposes of this invention).

When X is alkylene, it can have 1 to 4 carbon atoms and be further substituted similarly to the alkyl and alkoxy groups. In addition, the alkylene group can be a substituted or unsubstituted cycloalkylene group having at least 5 carbon atoms in the ring and chain. Ar is a substituted or unsubstituted, 6 or 10-membered carbocyclic aromatic group such as substituted or unsubstituted phenyl and naphthyl groups. Typically, Ar is an unsubstituted phenyl group.

In some embodiments, the polymeric binder comprises recurring units represented by Structure (POLYMER) wherein a is from about 92 to about 98 mol %, b is from about 2 to about 8 mol % and Z is —C(=O)OH, and is present at a dry coverage of from about 15 to 100 weight % based on the total dry weight of the layer.

Class b) Polymers:

Examples of Class b) polymers include but are not limited to the co-polymers derived at least in part from group ($a_1$) monomer described below and group ($b_1$) monomer described below with at least about 15 mol % of recurring units from the group ($a_1$) monomers and at least about 10 mol % of recurring units from the group ($b_1$) monomers. When electron deficient olefins, such as maleic anhydride or a maleimide are used as group ($b_1$) monomer, 1:1 alternating co-polymers (that is, 50 mol % of the group ($a_1$) monomer and 50 mol % of the group ($b_1$)) are typically produced.

Group ($a_1$) monomers include norbornene and norbornene derivatives such as:

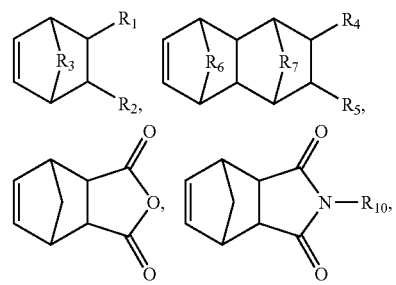

and mixtures thereof

Group ($b_1$) monomers include:

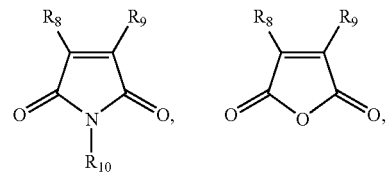

acrylonitrile, methacrylonitrile, styrene, hydroxystyrene, CH($R_{11}$)CH(CO$_2R_{12}$), CH($R_{11}$)CH(CON($R_{12}$)$_2$), CH$_2$CH(OR$_{12}$), and mixtures thereof $R_1$, $R_2$, $R_4$, and $R_5$ are each independently hydrogen, phenyl, substituted phenyl, halogen, alkyl of 1 to 6 carbon atoms, alkoxy of 1 to 6 carbon atoms, acyl of 1 to 7 carbon atoms, acyloxy of 1 to 7 carbon atoms, carboalkoxy of 1 to 7 carbon atoms, or a mixture thereof. Substituted phenyl groups include, for example, 2-methylphenyl, 3-methylphenyl, 4-methylphenyl, 4-t-butylphenyl, 4-methoxyphenyl, 3-ethoxyphenyl, 4-cyanophenyl, 4-chlorophenyl, 4-fluorophenyl, 4-acetoxyphenyl, 4-carboxyphenyl, 4-carboxymethylphenyl, 4-carboxyethylphenyl, 3,5-dichlorophenyl, and 2,4,6-trimethylphenyl. Halogen includes fluoro, chloro, and bromo. Examples are $CH_3CO-$ (acetyl), $CH_3CH_2CO-$, $CH_3(CH_2)_2CO-$, $CH_3(CH_2)_3CO-$, $(CH_3)_3CCO-$, and $(CH_3)_3CCH_2CO-$. Acyloxy groups of 1 to 7 carbon atoms are $-OC(O)R$ groups in which R is an alkyl group of 1 to 6 carbon atoms, such as are listed above. Examples are $H_3CC(=O)O-$ (acetyloxy), $CH_3CH_2C(=O)O-$, $CH_3(CH_2)_2C(=O)O-$, $CH_3(CH_2)_3C(=O)O-$, $(CH_3)_3CC(=O)O-$, and $(CH_3)_3CCH_2C(=O)O-$, Carboalkoxy groups of 1 to 7 carbon atoms are $-CO_2R$ groups in which R is an alkyl group of 1 to 6 carbon atoms, such as are listed above. Examples are $-C(=O)OCH_3$, (carbomethoxy), $-C(=O)OCH_2CH_3$, $-C(=O)O(CH_2)_2CH_3$, $-C(=O)O(CH_2)_3CH_3$, $-C(=O)OC(CH_3)_3$ (carbo-t-butoxy), $-C(=O)OCH_2C(CH_3)_3$, $-C(=O)O(CH_2)_4CH_3$, and $-C(=O)O(CH_2)_5CH_3$. $R_3$, $R_6$, and $R_7$ are each $-CH_2-$. Each $R_8$ and $R_9$ is each independently hydrogen or methyl, or a mixture thereof, typically hydrogen. $R_{10}$ is hydrogen, hydroxyl, alkyl of 1 to 6 carbon atoms, phenyl, substituted phenyl, benzyl, or a mixture thereof. Each $R_{11}$ is independently hydrogen, methyl, or a mixture thereof. Each $R_{12}$ is independently hydrogen, alkyl of 1 to 6 carbon atoms, phenyl or a mixture thereof, typically hydrogen, methyl, or a mixture thereof.

More specifically, group ($a_1$) monomers include but are not limited to, norbornene (bicyclo[2.2.1]hept-2-ene) and its derivatives, such as methyl 5-norbornene-2-carboxylate, t-butyl 5-norbornene-2-carboxylate, and other esters of 5-norbornene-2-carboxylic acid; cis-5-norbornene-endo-2,3-dicarboxylic anhydride and the corresponding imides, such as the N-methyl, N-hydroxyl, N-phenyl, N-cyclohexyl, and the N-benzyl imides; tetracyclododecene (tetracyclo[4.4.0.1$^{2,5}$.1$^{7,10}$]dodec-3-ene) and its derivatives, such as the esters of (tetracyclo[4.4.0.1$^{2,5}$.1$^{7,10}$]dodec-3-ene-8-carboxylic acid, for example methyl (tetracyclo[4.4.0.1$^{2,5}$.1$^{7,10}$]dodec-3-ene) -8-carboxylate, ethyl (tetracyclo[4.4.0.1$^{2,5}$.1$^{7,10}$]dodec-3-ene) -8-carboxylate, and t-butyl (tetracyclo[4.4.0.1$^{2,5}$.1$^{7,10}$]dodec-3-ene) -8-carboxylate; (tetracyclo[4.4.0.1$^{2,5}$.1$^{7,10}$]dodec-3-ene-endo-8,9-dicarboxylic acid and its corresponding imides, such as the N-methyl, N-hydroxyl, N-phenyl, N-cyclohexyl, and the N-benzyl imides; and mixtures thereof.

Group ($b_1$) include but are not limited to, acrylonitrile, methacrylonitrile, hydroxystyrene, acrylic acid esters such as methyl acrylate, ethyl acrylate, propyl acrylate, butyl acrylate, and phenyl acrylate; methacrylic acid esters such as methyl methacrylate, ethyl methacrylate, propyl methacrylate, butyl methacrylate, and phenyl methacrylate; methacrylamides and acrylamides, such as methacrylamide, acrylamide, N,N-dimethyl acrylamide, N,N-dimethyl methacrylamide, and the acrylamide and methacrylamide of p-aminobenzoic acid; maleic anhydride; maleic acid imides, such as N-phenylmaleimide, N-cyclohexylmaleimide, N-benzylmaleimide, N-methylmaleimide, N-hydroxylmaleimide; vinyl ethers, such as methyl vinyl ether and ethyl vinyl ether; and mixtures thereof.

Further details the Class b) polymers and methods of making them are provided in U.S. Pat. No. 6,969,570 (Kitson).

Class c) Polymers:

Examples of Class c) polymers include but are not limited to, copolymers derived at least in part from maleic anhydride and styrene or a substituted styrene or a mixture of substituted styrenes (styrene derivatives). Recurring units derived from maleic anhydride typically comprises from about 1 to about 50 mol % and more likely from about 15 to about 50 mol % of the co-polymer.

Typically, the styrene and substituted styrene styrenes can be represented by the formula $CH_2=CH(C_6H_4R^1)$. The substituent $R^1$ may be o-, m-, or p- to the vinyl ($CH_2=CH-$) group. $R^1$ can be hydrogen, halogen, hydroxyl, cyano, sulfonamide, alkyl of 1 to 6 carbon atoms, alkoxy of 1 to 6 carbon atoms, acyl of 1 to 7 carbon atoms, acyloxy of 1 to 7 carbon atoms, carboalkoxy of 1 to 7 carbon atoms, or a mixture thereof. Halogen includes fluoro, chloro, and bromo. An example of a sulfonamide group is $-SO_2NH_2$. Acyl groups of 1 to 7 carbon atoms are $-C(=O)R$ groups in which R is an alkyl group of 1 to 6 carbon atoms, such as are listed above. Examples are $CH_3CO-$(acetyl), $CH_3CH_2CO-$, $CH_3(CH_2)_2CO-$, $CH_3(CH_2)_3CO-$, $(CH_3)_3CCO-$, and $(CH_3)_3CCH_2CO-$. Acyloxy groups of 1 to 7 carbon atoms are $-OC(O)R$ groups in which R is an alkyl group of 1 to 6 carbon atoms, such as are listed above. Examples are $H_3CC(=O)O-$ (acetyloxy), $CH_3CH_2C(=O)O-$, $CH_3(CH_2)_2C(=O)O-$, $CH_3(CH_2)_3C(=O)O-$, $(CH_3)_3CC(=O)O-$, and $(CH_3)_3CCH_2C(=O)O-$. Carboalkoxy groups of 1 to 7 carbon atoms are $-CO_2R$ groups in which R is an alkyl group of 1 to 6 carbon atoms, such as are listed above. Examples are $-C(=O)OCH_3$, (carbomethoxy), $-C(=O)OCH_2CH_3$ (carboethoxy), $-C(=O)O(CH_2)_2CH_3$, $-C(=O)O(CH_2)_3CH_3$, $-C(=O)OC(CH_3)_3$ (carbo-t-butoxy), $-C(=O)OCH_2C(CH_3)_3$, $-C(=O)O(CH_2)_4CH_3$, and $-C(=O)O(CH_2)_5CH_3$. A useful monomer is styrene wherein $R_1$ is hydrogen in the noted formula.

Recurring units derived from additional monomers, such as acrylate and methacrylate monomers (such as methyl acrylate, ethyl acrylate, ethyl methacrylate, butyl acrylate, and butyl methacrylate), acrylonitrile; methacrylonitrile, methacrylamides (such as methacrylamide and N,N-dimethyl methacrylamide), and acrylamides (such as acrylamide and N,N-dimethyl acrylamide), may also be present, but are not required.

Further details of Class c) copolymers and methods of making them are provided for example in U.S. Patent Application Publication 2007/0065737 (Kitson et al.).

Class d) Polymers:

Examples of Class d) polymers include but are not limited to, copolymers are derived at least in part from methyl methacrylate and a carboxylic acid containing monomer, typically a carboxylic acid containing monomer of 14 or fewer carbon atoms, more typically a carboxylic acid containing monomer of 9 or fewer carbon atoms. A mixture of carboxylic acid containing monomers may also be used. Typical carboxylic acid containing monomers are acrylic acid, methacrylic acid, 3-vinyl benzoic acid, 4-vinyl benzoic acid, itaconic acid, maleic acid, and monomers formed by the reaction of a hydroxyl containing monomer, such as 2-hydroxyethyl acrylate or 2-hydroxyethyl methacrylate with a cyclic anhydride such as succinic anhydride or phthalic anhydride. A particularly useful carboxylic acid containing monomer is methacrylic acid.

The molar ratio of recurring units derived from methyl methacrylate to the recurring units derived from carboxylic acid containing monomer(s) is generally from about 80:20 to about 98:2 and typically from about 90:10 to about 95:5.

Recurring units derived from additional monomers, such as acrylate and other methacrylate monomers (such as methyl acrylate, ethyl acrylate, ethyl methacrylate, butyl acrylate, and butyl methacrylate), maleic anhydride, vinyl ethers (such as methyl vinyl ether), acrylonitrile, methacrylonitrile, methacrylamides (such as methacrylamide and N,N-dimethyl methacrylamide), and acrylamides (such as acrylamide and N,N-dimethyl acrylamide), may also be present, but are not required. Typically, the copolymer consists essentially of the methyl methacrylate and the carboxylic acid containing monomer or mixture of carboxylic acid containing monomers. The molecular weights of the Class d) copolymers are generally less than 200,000. Further details of the Class d) copolymers and methods of making them are also provided for example in U.S. Patent Application Publication 2007/0065737 (Kitson et al.).

Class e) Polymers:

Examples of Class e) polymers include but are not limited to, polymeric binders having a pKa of from about 6 to about 9 (typically from about 6 to about 8) that comprise a variety of groups (usually groups pendant to the polymer backbone) that are either directly or indirectly attached to the polymer backbone in sufficient quantity that will provide the desired pKa including, but not limited to, mercapto groups, sulfonamido groups, and N-substituted sulfonamido groups (including but not limited to, alkyl, acyl, alkoxycarbonyl, alkylaminocarbonyl, and β-keto ester substituted sulfonamido groups), α-cyano esters, α-cyano ketones, beta-diketones, and α-nitro esters. The unsubstituted and substituted sulfonamido groups are useful. These polymers can also comprise a mixture of the noted pendant groups along the polymer backbone.

More particularly, each of the Class e) polymers can comprise a polymer backbone and an —X—C(=T)-NR-S(=O)$_2$— moiety that is attached to and along the polymer backbone, wherein —X— is an oxy (—O—) or —NR'— group, T is O (forming an oxo group) or S (forming a thioxo group), and R and R' are independently hydrogen, halo, or a substituted or unsubstituted alkyl group having 1 to 6 carbon atoms. For example, R is hydrogen, T is O, and X is an oxy or —NH— group.

In some embodiments, the Class e) polymers comprise one or more acrylic resins that are derived from one or more ethylenically unsaturated polymerizable monomers, at least one of which monomers comprises pendant —X—C(=T)-NR—S(=O)$_2$—R$^3$ groups that are defined below.

More particularly, the Class e) polymers can be represented by the following Structure (E):

(E)

wherein R$^1$ is hydrogen, a substituted or unsubstituted alkyl group having 1 to 6 carbon atoms (such as methyl, ethyl, chloromethyl, iso-propyl and benzyl), or a halo group (such as fluoro, chloro, or bromo). For example, R$^1$ is hydrogen or a substituted or unsubstituted methyl or chloro group, or it is hydrogen or unsubstituted methyl.

R$^2$ represents the —X—C(=T)-NR—S(=O)$_2$—R$^3$ group wherein X, T, and R are as defined above, and R$^3$ is a substituted or unsubstituted aliphatic group or a substituted or unsubstituted aryl group directly attached to —S(=O)$_2$— through a carbon atom. More particularly, R$^3$ can represent a substituted or unsubstituted alkyl group having 1 to 12 carbon atoms, a substituted or unsubstituted cycloalkylene group having 5 to 10 carbon atoms in the ring, a substituted or unsubstituted aryl group having 6 to 10 carbon atoms in the ring, or a substituted or unsubstituted heterocyclyl group, or any combinations of such groups that are linked directly together, or linked together with oxy, carbonyl, amido, thio, or other groups that would be readily apparent to one skilled in the art. For example, R$^3$ is a substituted or unsubstituted phenyl group.

L is a direct bond or a linking group, including but not limited to substituted or unsubstituted alkylene, cycloalkylene, arylene, a divalent heterocyclic, carbonyloxy, thio, oxy, or amido groups, or combinations thereof. The substituted or unsubstituted alkylene groups can have 1 to 6 carbon atoms (such as methylene, 1,2-ethylene, 1,1-ethylene, n-propylene, iso-propylene, t-butylene, n-butylene, and n-hexylene groups), substituted cycloalkylene groups can have 5 to 7 carbon atoms in the cyclic ring (such as cyclopentylene and 1,4-cyclohexylene), the substituted or unsubstituted arylene groups can have 6 to 10 carbon atoms in the aromatic ring (such as 1,4-phenylene, naphthylene, 2-methyl-1,4-phenylene, and 4-chloro-1,3-phenylene groups), and the substituted or unsubstituted, aromatic or non-aromatic divalent heterocyclic groups can have 5 to 10 carbon and one or more heteroatoms (nitrogen, oxygen, or sulfur atoms) in the cyclic ring (such as pyridylene, pyrazylene, pyrimidylene, or thiazolylene groups). Combinations of two or more of these divalent linking groups can be used.

It is useful that L represent a carboxylic acid ester group such as a substituted or unsubstituted —C(=O)O-alkylene, —C(=O)O-alkylene-phenylene-, or —C(=O)O-phenylene group wherein alkylene has 1 to 4 carbon atoms. More preferably, L is a —C(=O)O-alkylene, —C(=O)O-alkylene-phenylene-, or —C(=O)O-phenylene group and most preferably, it is a —C(=O)O-alkylene group wherein the alkylene group has 1 or 2 carbon atoms.

In Structure (E) noted above, B represents recurring units derived from one or more ethylenically unsaturated polymerizable monomers that do not contain an R$^2$ group, including but not limited to, recurring units derived from a (meth)acrylate, (meth)acrylamide, vinyl ether, vinyl ester, vinyl ketone, olefin, unsaturated imide (such as maleimide), N-vinyl pyrrolidone, N-vinyl carbazole, 4-vinyl pyridine, (meth)acrylonitrile, unsaturated anhydride, or styrenic monomer. Preferably, the B recurring units are derived from one or more (meth)acrylates, styrenic monomers, (meth)acrylonitriles, (meth)acrylamides, or combinations thereof. Mixtures of monomers can be used to provide a mixture of recurring units represented by "B" in Structure (E).

In Structure (E), x is from about 20 to 85 weight %, and y is from about 15 to about 80 weight %.

Examples of useful monomers containing R$^2$ groups that are useful for these polymeric binders are the following ethylenically unsaturated polymerizable monomers A-I through A-6:

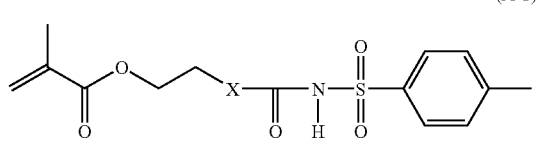

(A-1)

wherein X is as defined above,

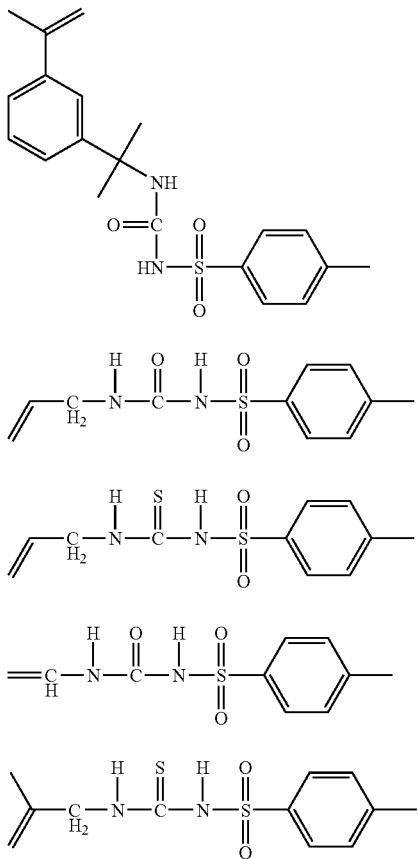

Further details of Class e) polymers and methods of making them are provided in U.S. Pat. No. 7,241,556 (Saraiya et al.).

Class f) Polymers:

Examples of Class f) polymers include but are not limited to, those described in U.S. Pat. No. 7,169,518 (Savariar-Hauck et al.) that also provides details about making these polymers. In particular, these polymeric binders comprise recurring units having pendant carboxy groups that are generally represented by the following Structure (I-F) or (II-F), which recurring units generally comprise at least 3 mol % of the total recurring units in the polymeric binder:

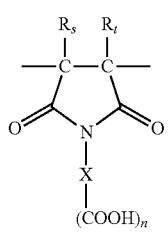
(I-F)

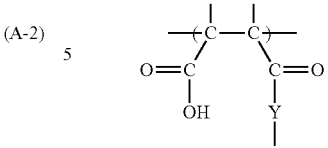
(II-F)

wherein n is 1 to 3 (typically 1 or 2). $R_s$ and $R_t$ are independently hydrogen or a substituted or unsubstituted alkyl group having 1 to 7 carbon atoms (such as methyl, ethyl, t-butyl, or benzyl), or a halo group (such as chloro or bromo). For example, $R_s$ and $R_t$ are independently hydrogen or a substituted or unsubstituted methyl group or chloro group.

X is a multivalent linking group including, but not limited to multivalent aliphatic and aromatic linking groups, and combinations thereof. In most embodiments, X is a divalent linking group. Such groups can include alkylene, arylene, alkylenearylene, arylenealkylene, alkyleneoxyalkylene, aryleneoxyarylene, and alkyleneoxyarylene groups, all of which can be unsubstituted or substituted with one or more substituents that do not adversely affect the performance of the second polymeric binder. For example, X is a substituted or unsubstituted phenylene group, especially when n is 1.

In Structure (II-F), Y is oxy or —NR— wherein R is hydrogen or a substituted or unsubstituted alkyl group having 1 to 10 carbon atoms (such as methyl, ethyl, iso-propyl, n-hexyl, and benzyl groups) or substituted or unsubstituted aryl group (such as a phenyl group).

Also in Structure (II-F), Z is a monovalent organic group including but not limited to, a monovalent aliphatic or aromatic group, or a combination thereof. Such groups are defined similar to the multivalent groups described above for X but can also include arylene or alkylene groups, or combinations thereof, with or without carbonyl groups [—C(=O)—] or amido groups (—NH—) groups, or combinations thereof. For example, useful Z groups include —R'—NHC(=O)R" groups wherein R' is a substituted or unsubstituted alkylene group having 2 to 6 carbon atoms (such as ethylene and iso-propylene), and R" is a substituted or unsubstituted alkyl group having 1 to about 10 carbon atoms (such as methyl, methoxymethyl, ethyl, iso-propyl, n-hexyl, and benzyl groups) or a substituted or unsubstituted aryl group (such as a phenyl group). One useful Z group is a —CH$_2$CH$_2$NHC(=O)-phenyl group.

Z can also be a substituted or unsubstituted alkyl group having 1 to 10 carbon atoms (such as methyl, ethyl, iso-propyl, t-butyl, n-hexyl, and benzyl groups). Useful alkyl groups for Z include those having 1 to 8 carbon atoms (including straight-chain and branched butyl groups).

The Class f) polymeric binders generally has an acid number of at least 20 mg KOH/g and typically of from about 25 to about 45 mg KOH/g, and a number average molecular weight of at least 1,000 and up to 250,000, and typically from about 10,000 to about 150,000 as measured using known techniques.

The Class f) polymeric binders can also be represented by the following Structure (III-F):

$$-(A)_x-(B)_y-$$ (III-F)

wherein A represents recurring units defined by either Structure (I-F) or (II-F) or both Structures (I-F) and (II-F). Thus, multiple types of monomers can be used to provide the A recurring units. In Structure (III-F), x is about 3 to about 15 mol % and y is from about 85 to about 97 mol %.

B represents recurring units other than those represented by A. They can be derived from one or more ethylenically unsaturated polymerizable monomers that are capable of copolymerizing with the monomers from which the A recurring units are derived, including maleic acid anhydride. Representative useful monomers for the B recurring units include but are not limited to, (meth)acrylates, (meth)acrylamides, vinyl ethers, vinyl esters, vinyl ketones, olefins, unsaturated imides including N-maleimides, unsaturated anhydrides such as maleic anhydrides, N-vinyl pyrrolidone, N-vinyl carbazole, 4-vinyl pyridine, (meth)acrylonitriles, or styrenic monomers, or any combinations of these monomers. Specific monomers of these and similar classes are described for example, in paragraphs [0044] through [0054] of U.S. Patent Application Publication 2004/0137366 (corresponding to EP 1,433,594A).

For example, B represents recurring units for Structure (III-F) that are derived from one or more (meth)acrylates, (meth)acrylonitriles, N-phenylmaleimide, or (meth)acrylamides such as N-alkoxyalkyl methacrylamides, or combinations of two or more of such monomers. Some useful monomers from which B recurring units are derived include methyl methacrylate, styrene, ethylenically unsaturated polymerizable monomers having pendant cyclic urea groups, and combinations thereof.

The one or more polymeric binders (of any class) can be present in the outer layer at a dry coverage of from about 15 to 100 weight % and typically from about 30 to about 95 weight %.

In some embodiments, the lithographic printing plate precursor inner layer comprises a first polymeric binder that is a polymer derived at least in part from (meth)acrylamide, a polymer derived at least in part from a (meth)acrylonitrile, a polymer derived at least in part from an N-substituted cyclic imide, or a polymer derived at least in part from styrene or a styrene derivative, and the outer layer comprises a second polymeric binder that is a copolymer derived from styrene and maleic anhydride or a polymer derived at least in part from monomer having a pendant —O—C(=O)—NH—S(=O)$_2$— methylphenyl group. For example, the second polymeric binder can have recurring units derived from the following monomer:

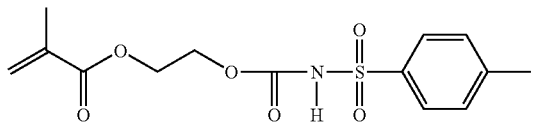

In addition, solubility-suppressing components are optionally incorporated into the outer layer. Such components act as dissolution inhibitors that function as solubility-suppressing components for the polymeric binders. Dissolution inhibitors typically have polar functional groups that are believed to act as acceptor sites for hydrogen bonding with various groups in the polymeric binders. The acceptor sites comprise atoms with high electron density, and can be selected from electronegative first row elements such as carbon, nitrogen, and oxygen. Dissolution inhibitors that are soluble in the alkaline developer are useful. Useful polar groups for dissolution inhibitors include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetralkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Useful dissolution inhibitors include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France).

The outer layer generally also includes colorants. Useful colorants are described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the developed lithographic printing plate.

The outer layer can optionally also include contrast dyes, printout dyes, coating surfactants, dispersing aids, humectants, biocides, viscosity builders, drying agents, defoamers, preservatives, and antioxidants.

The outer layer generally has a dry coating coverage of from about 0.2 to about 2 g/m$^2$ and typically from about 0.4 to about 1.5 g/m$^2$.

The imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers, or combinations thereof, or any other addenda commonly used in the lithographic art, in conventional amounts.

Intermediate drying steps may be used between applications of the various layer formulations to remove solvent(s) before coating other formulations. Drying steps may also help in preventing the mixing of the various layers.

There may be a separate layer that is between and in contact with the inner and outer layers. This separate layer can act as a barrier to minimize migration of radiation absorbing compound(s) from the inner layer to the outer layer. This separate "barrier" layer generally comprises a third polymeric binder that is soluble in the gum. If this third polymeric binder is different from the first polymeric binder(s) in the inner layer, it is typically soluble in at least one organic solvent in which the inner layer first polymeric binders are insoluble. A useful third polymeric binder is a poly(vinyl alcohol). Generally, this barrier layer should be less than one-fifth as thick as the inner layer, and typically less than one-tenth as thick as the inner layer.

Alternatively, there may be a separate layer between the inner and outer layers that contains the infrared radiation absorbing compound(s), which may also be present in the inner layer, or solely in the separate layer.

Preparation of Lithographic Printing Plate Precursors

The multi-layer lithographic printing plate precursor can be prepared by sequentially applying an inner layer formulation over the surface of the hydrophilic substrate (and any other hydrophilic layers provided thereon), and then applying an outer layer formulation over the inner layer using conventional coating or lamination methods. It is important to avoid intermixing of the inner and outer layer formulations.

For example, a multi-layer lithographic printing plate precursor can be prepared with an inner layer comprising a first polymeric binder and a radiation absorbing compound, and an ink receptive outer layer comprising a second polymeric binder that: (1) is different than the first polymeric binder, (2) is insoluble in the processing solution (defined below) before infrared radiation exposure, and (3) soluble in the processing solution after such exposure.

The inner and outer layers can be applied by dispersing or dissolving the desired ingredients in a suitable coating solvent(s), and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the inner and outer layers depends upon the nature of the first and second polymeric binders, other polymeric materials, and other components in the formulations. To prevent the inner and outer layer formulations from mixing or the inner layer from dissolving when the outer layer formulation is applied, the outer layer formulation should be coated from a solvent in which the first polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

The outer layer formulation can be coated out of solvents or solvent mixtures that do not dissolve the inner layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and represents poly(ethylene glycol) methyl ether methacrylate (PGMEA), or a mixture of DEK, PMA, and isopropyl alcohol.

Alternatively, the inner and outer layers may be applied by extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

After drying the layers, the lithographic printing plate precursors can be further "conditioned" with a heat treatment at from about 40 to about 90° C. for at least 4 hours (for example, at least 20 hours) under conditions that inhibit the removal of moisture from the dried layers. For example, the heat treatment is carried out at from about 50 to about 70° C. for at least 24 hours. During the heat treatment, the lithographic printing plate precursor is wrapped or encased in a water-impermeable sheet material to represent an effective barrier to moisture removal from the precursor, or the heat treatment of the precursor is carried out in an environment in which relative humidity is controlled to at least 25%. In addition, the water-impermeable sheet material can be sealed around the edges of the precursor, with the water-impermeable sheet material being a polymeric film or metal foil that is sealed around the edges of the precursor.

In some embodiments, this heat treatment can be carried out with a stack comprising at least 100 of the same lithographic printing plate precursors, or when the precursor is in the form of a coil or web. While being conditioned in a stack, the individual precursors may be separated by suitable interleaving papers. Such papers are available from several commercial sources. The interleaving papers may be kept between the precursors after conditioning during packing and shipping and until they are used by the customer.

Representative methods for preparing multi-layer lithographic printing plates according to this invention are shown in the Examples below.

Imaging and Processing

The lithographic printing plate precursors can have any useful form including, but not limited to, flat plates, printing cylinders, printing sleeves (solid or hollow cores) and printing tapes (including flexible printing webs).

Lithographic printing plate precursors can be of any size or shape (for example, square or rectangular) having the requisite one or more imageable layers disposed on a suitable substrate. Printing cylinders and sleeves are known as rotary printing members having a substrate and at least one imageable layer in cylindrical form. Hollow or solid metal cores can be used as substrates for printing sleeves.

During use, the lithographic printing plate precursors are exposed to a suitable source of infrared radiation at a wavelength of from about 600 to about 1500 nm and typically from about 700 to about 1200 nm. The lasers used for exposure are usually diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the printing plate mounted to the interior or exterior cylindrical surface of the drum. Examples of useful imaging apparatus are available as models of Kodak® Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image a precursor while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 mj/cm$^2$, and typically from about 75 to about 400 mJ/cm$^2$.

While laser imaging is useful in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025

(Martin et al.) and as used in thermal fax machines and sublimation printers. Thermal print heads are commercially available (for example, as a Fujitsu Thermal Head FTP-040 MCS100 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Imaging of the lithographic printing plate precursor produces a lithographic printing plate that comprises a latent image of imaged (exposed) and non-imaged (non-exposed) regions.

With or without a post-exposure baking (or pre-heat) step after imaging and before processing, the imaged lithographic printing plate precursors are processed "off-press" using a processing solution as described below. Processing the imaged element with the processing solution is carried out for a time sufficient to remove predominantly only the exposed regions of the outer layer and the underlying portions of underlayers (such as the inner layer), and to reveal the hydrophilic surface of the substrate, but not long enough to remove significant amounts of the non-exposed regions. Thus, the lithographic printing plate precursors are "positive-working". The revealed hydrophilic surface repels ink while the non-exposed (or non-imaged) regions accept ink. The imaged (exposed) regions of the imageable layer(s) are described as being "soluble" or "removable" in the processing solution because they are removed, dissolved, or dispersed within it more readily than the non-imaged (non-exposed) regions. Thus, the term "soluble" also means "dispersible".

The single processing solution both "develops" the imaged precursors by removing predominantly only the exposed regions (development) and also provides a protective layer or coating over the entire imaged and developed surface. In this second aspect, the processing solution can behave somewhat like a gum that is capable of protecting the lithographic image on the printing plate against contamination or damage (for example, from oxidation, fingerprints, dust, or scratches).

There are generally two types of "gum" solutions known in the art: (1) a "bake", "baking", or "pre-bake" gum usually contains one or more compounds that do not evaporate at the usual pre-bake temperatures used for making lithographic printing plates, typically an anionic or nonionic surfactant, and (2) a "finisher" gum that usually contains one or more hydrophilic polymers (both synthetic and naturally-occurring, such as gum Arabic cellulosic compounds, (meth) acrylic acid polymers, and polysaccharides) that are useful for providing a protective overcoat on a printing plate. The processing solution used in the practice of this invention could be generally considered a "pre-bake" gum and thus usually lack the hydrophilic polymers of finishing gums.

By using the single processing solution described herein, the conventional aqueous alkaline developer compositions containing silicates or metasilicates, or various organic solvents, are avoided. Moreover, one advantage of this invention is that once the processing solution is used in this manner, no separate rinsing step is necessary before using the resulting lithographic printing plate for printing. However, before printing, any excess processing solution may be removed from the lithographic printing plate by wiping or use of a squeegee or a pair of nip rollers in an apparatus, followed by optional drying using any suitable drying means.

The processing solution may be provided in diluted or concentrated form. The amounts of components described below refer to amounts in the diluted processing solution that is the most likely form for use in the practice of the invention. However, it is to be understood that the present invention includes the use of concentrated processing solutions and the amounts of various components (such as the anionic surfactants) would be correspondingly higher.

The processing solution used in the practice of this invention is an aqueous solution that generally has a pH greater than 6 and up to about 11, and typically from about 6.5 to about 11, or from about 7 to about 10.5, as adjusted using a suitable amount of an acid or base. The viscosity of the processing solution can be adjusted to a value of from about 1.7 to about 5 cP by adding a suitable amount of a viscosity-increasing compound such as a poly(vinyl alcohol) or poly(ethylene oxide).

Various components can be present in the single processing solution to provide the development and gumming functions, except for those components specifically excluded above.

For example, some of the single processing solutions have as an essential component, one or more anionic surfactants, even though optional components (described below) can be present if desired. Useful anionic surfactants include those with carboxylic acid, sulfonic acid, or phosphonic acid groups (or salts thereof). Anionic surfactants having sulfonic acid (or salts thereof) groups are particularly useful. For example, such anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxy-ethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylester, salts of alkylsulfuric esters, sulfuric esters of polyoxy-ethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition.

Particular examples of such anionic surfactants include but are not limited to, sodium dodecylphenoxyoxybenzene disulfonate, the sodium salt of alkylated naphthalenesulfonate, disodium methylene-dinaphthalene disulfonate, sodium dodecylbenzenesulfonate, sulfonated alkyl-diphenyloxide, ammonium or potassium perfluoroalkylsulfonate and sodium dioctylsulfosuccinate.

The one or more anionic surfactants can be generally present in an amount of at least 1 weight %, and typically from about 5 weight % or from about 8 weight % and up to about 45 weight %, or up to about 30 weight % (% solids). In some embodiments, the one or more anionic surfactants can be present in an amount of from about 8 to about 20 weight %.

Two or more anionic surfactants ("first", "second", etc.) can also be used in combination. In such mixtures, a first anionic surfactant, such as an alkyldiphenyloxide disulfonate, can be present generally in an amount of at least 1 weight % and typically from about 5 to about 20 weight %. A second surfactant can be present (same or different from the first anionic surfactant) in a total amount of at least 1 weight %, and typically from about 3 to about 20 weight %. Second or additional anionic surfactants can be selected from the substituted aromatic alkali alkyl sulfonates and aliphatic alkali sulfates. One particular combination of anionic surfactants includes one or more alkyldiphenyloxide disulfonates and one or more aromatic alkali alkyl sulfonates (such as an alkali alkyl naphthalene sulfonate).

The single processing solutions useful in this invention may optionally include nonionic surfactants as described in [0029] or hydrophilic polymers described in [0024] of EP 1,751,625 (noted above), incorporated herein by reference. Particularly useful nonionic surfactants include Mazol® PG031-K (a triglycerol monooleate, Tween® 80 (a sorbitan derivative), Pluronic® L62LF (a block copolymer of propylene oxide and ethylene oxide), and Zonyl® FSN (a fluorocarbon), and a nonionic surfactant for successfully coating the processing solution onto the printing plate surface, such as a nonionic polyglycol. These nonionic surfactants can be present in an amount of up to 10 weight %, but at usually less than 2 weight % (% solids).

Other optional components of the single processing solution include inorganic salts (such as those described in [0032] of U.S. Patent Application Publication 2005/0266349, noted above), wetting agents (such as a glycol), metal chelating agents, antiseptic agents, organic amines, anti-foaming agents, ink receptivity agents (such as those described in [0038] of US '349), and viscosity increasing agents as noted above. Useful amounts of such components are known in the art from their use in traditional alkaline developers or gum solutions. Other useful addenda include but not limited to, phosphonic acids or polycarboxylic acids, or salts thereof that are different than the anionic surfactants described above. Such acids can be present in an amount of at least 0.001 weight % and typically from about 0.001 to about 10 weight % (% solids), and can include but are not limited to, polyaminopolycarboxylic acids, aminopolycarboxylic acids, or salts thereof, [such as salts of ethylenediaminetetraacetic acid (EDTA, sodium salt)], organic phosphonic acids and salts thereof, and phosphonoalkanetricarboxylic acids and salts thereof.

Generally, after imaging, the single processing solution is applied to the imaged precursor by rubbing, spraying, jetting, dipping, immersing, coating, or wiping the outer layer with the single processing solution or contacting the imaged precursor with a roller, impregnated pad, or applicator containing the single processing solution. For example, the imaged element can be brushed with the processing solution, or the processing solution can be poured onto or applied by spraying the imaged surface with sufficient force to remove the exposed regions using a spray nozzle system as described for example in [0124] of EP 1,788,431A2 (noted above). Still again, the imaged element can be immersed in the single processing solution and rubbed by hand or with an apparatus.

The single processing solution can also be applied in a processing unit (or station) as a component of a suitable apparatus that has at least one roller for rubbing or brushing the precursor while the single processing solution is applied. By using such a processing unit, the exposed regions of the imaged layer may be removed from the substrate more completely and quickly. Residual single processing solution may be removed (for example, using a squeegee or nip rollers) or left on the resulting printing plate (and dried) without any rinsing step. It is desirable that processing be carried out using processor systems and apparatus that allow the processing solution to reside on the imaged precursor for sufficient time of interaction between the processing solution and the precursor imaged coatings before mechanical means (such as brush or plush rollers) are used.

Excess single processing solution can be collected in a tank and used several times, and replenished if necessary from a reservoir of "fresh" single processing solution. A replenisher solution can be of the same concentration as that used during processing, it can be provided in concentrated form and diluted with water at an appropriate time, or it can be comprise an entirely different composition.

Following processing, the resulting lithographic printing plate can be used for printing without any need for a separate rinsing step using water.

The resulting lithographic printing plates can also be baked in a postbake operation that can be carried out to increase run length. Baking can be carried out, for example, in a suitable oven at a temperature of less than 300° C. and typically at less than 250° C. for from about 2 to about 10 minutes. More typically, the baking is done very quickly at a temperature of from about 160° C. to about 220° C. (for example, at 190° C.) for up to five minutes (for example, up to two minutes). In some embodiments, the lithographic printing plates are post-baked at from about 160 to about 220° C. for up to two minutes Alternatively, the lithographic printing plates can be baked or cured by overall exposure to IR radiation at a wavelength of from about 800 to about 850 nm. This exposure creates conditions that enable very controllable baking effects with minimal distortion. For example, the lithographic printing plates can be passed through a commercial QuickBake 1250 oven (available from Eastman Kodak Company) at 4 feet (1.3 m) per minute at the 45% power setting of an infrared lamp to achieve a similar baking result from heating the plate in an oven at 200° C. for 2 minutes.

A lithographic ink and fountain solution can be applied to the printing surface of the lithographic printing plate for printing. The non-exposed regions of the outermost layer take up ink and the hydrophilic surface of the substrate revealed by the imaging and processing takes up the fountain solution. The ink is then transferred to a suitable receiving material (such as cloth, paper, metal, glass, or plastic) to provide one or more desired impressions of the image thereon. If desired, an intermediate "blanket" roller can be used to transfer the ink from the printing plate to the receiving material. The printing plates can be cleaned between impressions, if desired, using conventional cleaning means and chemicals.

The following examples are presented to illustrate the practice of this invention but are not intended to be limiting in any manner.

EXAMPLES

Materials and Methods:

Agfa Thermotect washout storage gum was obtained from Agfa Corporation (Ridgefield Park, N.J.).

Agfa RC510 washout storage gum was also obtained from Agfa Corporation.

Aqua-image cleaner/preserver is available from Eastman Kodak Company (Rochester, N.Y.).

Byk® 307 is a polyethoxylated dimethylpolysiloxane copolymer that is available from Byk Chemie (Wallingford, Conn.) in a 25 wt. % xylene/-methoxypropyl acetate solution.

Byk® 331 is a polyether modified dimethylpolysiloxane copolymer that is available from Byk Chemie.

BLO represents γ-butyrolactone.

Copolymer A represents a copolymer having recurring units derived from N-phenyl maleimide, methacrylamide, and methacrylic acid (41.5:37.5:21 mol %) using conventional conditions and procedures.

Copolymer B represents a copolymer having recurring units derived from N-phenyl maleimide, methacrylamide, methacrylic acid, acrylonitrile, styrene, and ethylene glycol methacrylate phosphate (12:33:12:34:6:3 mol %) using conventional conditions and procedures.

Copolymer C represents a copolymer derived from methyl methacrylate, benzyl methacrylate, and Intermediate A (described below) (30:15:55% by weight) using conventional conditions and procedures.

Copolymer D represents a copolymer derived from carboxyphenyl methacrylamide, acrylonitrile, methacrylamide, and N-phenyl maleimide (37/48/10/5 wt. %) using conventional conditions and procedures.

Copolymer E is a copolymer derived from methyl methacrylate, benzyl methacrylate, and Intermediate A (24/24/52% by weight) using conventional conditions and procedures.

Crystal Violet is a violet dye C.I. 42555; CAS 548-62-9 [(p-$(CH_3)_2NC_6H_4)_3C^+Cl^-$] that is available from Aldrich (Milwaukee, Wis.).

D11 represents ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl-4-hydroxy-2-methoxybenzenesulfonic acid (1:1) as supplied by PCAS (Longjumeau, France).

DEK represents diethyl ketone.

Dow Additive 19 is a silicone additive available from Dow Corning, Mich., USA.

Ethyl violet is assigned C.I. 42600 (CAS 2390-59-2, $\lambda_{max}$=596 nm) and has the formula of p-$(CH_3CH_2)_2NC_6H_4)_3$ $C^+Cl^-$.

Gum M1 is a prebake gum consisting of MX1591 (960 parts) and EDTA tetrasodium salt (40 parts) and had a pH of 9.9.

Gum N1 (also N1 finisher gum) is a prebake gum consisting of MX1591 (980 parts) and EDTA tetrasodium salt (20 parts) and had a pH of 9.4.

Intermediate A was prepared by charging dimethylacetamide (246.6 g), HEMA, 2-hydroxy ethyl methacrylate (65 g), and dibutyl tin dilaurate (0.42 g) into a 500 ml 4-neck ground glass flask, equipped with a heating mantle, temperature controller, mechanical stirrer, condenser, pressure equalized addition funnel and nitrogen inlet. The reaction mixture was heated to 60° C. under nitrogen atmosphere. Then, p-toluene sulfonyl isocyanate (98.6 g) was added at 60° C. over a period of one hour. The reaction was completed in six hours as determined by the disappearance of isocyanate infrared absorption band at 2275 cm$^{-1}$. At the end of the reaction, methanol (5 g) was added. The resulting intermediate had an acid number of 163.6 and was used to prepare Copolymer C.

IR Dye A is Kayasorb PS210CnE, an infrared absorbing dye as supplied by Nippon Kayaku Co, Ltd., Tokyo, Japan.

IR Dye B is an infrared absorbing dye supplied by Eastman Kodak of Rochester, N.Y. and has the following structure:

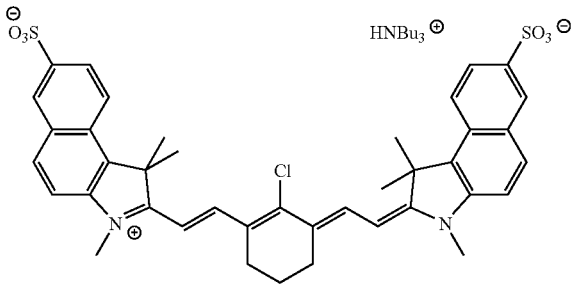

IR Dye B

A Mathias labdrier was obtained from Mathis USA Inc. (Concord, N.C.).

MX1591 is a prebake gum solution that is available from Eastman Kodak (Rochester, N.Y.).

PE3-S Positive Plate Image Remover was obtained from Kodak Japan Ltd. (Tokyo).

PGME represents 1-methoxypropan-2-ol (available as Dowanol® PM).

PGMEA represents poly(ethylene glycol) methyl ether methacrylate (50% water) that was obtained from Aldrich Chemical Company (Milwaukee, Wis.).

Quartz Rinse/Gum unit is available from Eastman Kodak Company (Rochester, N.Y.).

RX-04 is a copolymer of styrene and maleic anhydride that is available form Gifu Shellac, Japan.

Substrate A is a 0.3 mm gauge aluminum sheet that had been electrograined, anodized, and treated with poly(vinyl phosphonic acid).

T-95 resin is a polymer that was synthesized according to the following procedure:

Methyl cellusolve (199.8 g), N-methoxymethyl methacrylamide (18 g), benzyl methacrylate (11.4 g), methacrylic acid (3.0 g), dodecyl mercaptan (0.075 g), and azobisisobutyronitrile (Vazo-64 from DuPont, 0.6 g) were added to a 500 ml, 4-neck ground glass flask, equipped with a heating mantle, temperature controller, mechanical stirrer, condenser, and pressure equalized addition funnel and nitrogen inlet. The reaction mixture was heated to 80° C. under nitrogen atmosphere. Then, a premixture of N-methoxymethyl methacrylamide (55.0 g), benzyl methacrylate (34.0 g), methacrylic acid (9.0 g), dodecyl mercaptan (0.225 g), azobisisobutyronitrile (1.2 g) was added over two hours at 80° C. The reaction was continued another 8 hours and during which the initiator (0.35 g) was added two more times. The resulting polymer conversion was about 99% based on a determination of percent on-volatiles. The weight ratio of N-methoxymethyl methacrylamide/benzyl methacrylate/methacrylic acid was 56/34.8/9.2. The resin solution was precipitated in powder form using deionized water/ice (3:1) using a Lab Dispersator (4000 rpm) and then it was filtered. The powder was dried at room temperature for 24 hours, and the next day a tray was placed in an over and dried at 43° C. for two days. The yield was 95% and the acid number was 58 (actual) versus 58.8 (theoretical).

UV plate cleaner was obtained from Allied Pressroom Chemistry, Inc. (Hollywood, Fla.).

Varn Litho Etch 142W fountain solution was obtained from Varn International (Addison, Ill.).

Varn-120 plate cleaner was also obtained from Varn International.

Varn PAR alcohol replacement was obtained from Varn International.

| Inner Layer Formulation 1: | |
| --- | --- |
| Copolymer A | 4.54 g |
| Copolymer D | 2.25 g |
| IR Dye A | 0.756 g |
| IR Dye B | 0.504 g |
| Byk ® 307 (10% solution in DEK) | 0.840 g |
| Solvent: (MEK/PGME/BLO/water 50/30/10/10 wt %) | 110 g |

| Inner Layer Formulation 2: | |
| --- | --- |
| Copolymer B | 6.47 g |
| IR Dye A | 0.936 g |
| D11 | 0.078 g |
| Dow Additive 19 | 0.234 g |
| Byk ® 307 (10% solution in DEK) | 0.780 g |
| Solvent: (MEK/PGME/BLO/water 50/30/10/10 wt %) | 112 g |

| Inner Layer Formulation 3: | |
| --- | --- |
| Copolymer A | 7.01 g |
| Copolymer D | 5.34 g |
| IR dye A | 1.22 g |
| IR dye B | 0.910 g |
| D11 | 0.110 g |
| Dow Additive 19 | 0.530 g |
| Byk ® 307 (10% solution in DEK) | 1.14 g |
| Solvent (MEK/PGME/BLO/water 50/30/10/10 wt. %) | 234 g |

| Inner Layer Formulation 4: | |
| --- | --- |
| Copolymer B | 11.1 g |
| IR dye A | 1.59 g |
| D11 | 0.100 g |
| Dow Additive 19 | 0.430 g |
| Byk ® 331 | 0.030 g |
| Solvent (MEK/PGME/BLO/water 50/30/10/10 wt. %) | 237 g |

| Inner Layer Formulation 5: | |
| --- | --- |
| Polymer A | 0.543 g |
| Polymer D | 0.700 g |
| T95 resin | 0.263 g |
| IR dye A | 0.210 g |
| D11 | 0.018 g |
| Byk ® 307 (10% solution in DEK) | 1.75 g |
| Solvent: (MEK/PGME/BLO/water 50/30/10/10 wt %) | 16.4 g |

| Outer Layer Formulation 1: | |
| --- | --- |
| Copolymer C | 3.96 g |
| Ethyl violet | 0.012 g |
| Byk ® 307 (10% solution in DEK) | 0.280 g |
| Solvent: (DEK/PGMEA 92/8 wt %) | 75.8 g |

| Outer Layer Formulation 2: | |
| --- | --- |
| RX-04 | 3.56 g |
| Ethyl violet | 0.011 g |
| Byk ® 307 (10% solution in DEK) | 0.252 g |
| Solvent: (DEK/PGMEA 92/8 wt %) | 76.2 g |

| Outer Layer Formulation 3: | |
| --- | --- |
| Copolymer E | 7.28 g |
| Ethyl violet | 0.022 g |
| Byk ® 307 (10% solution in DEK) | 0.51 g |
| Solvent (DEK/PGMEA 92/8 wt. %) | 192 g |

| Outer Layer Formulation 4: | |
| --- | --- |
| RX-04 | 5.44 g |
| Crystal violet | 0.060 g |
| Dow Additive 19 | 0.020 g |
| Solvent (DEK/PGMEA 92/8 wt. %) | 194 g |

| Outer Layer Formulation 5: | |
| --- | --- |
| Polymer E | 1.49 g |
| Ethyl violet (1% solution in acetone) | 0.45 g |
| Byk ® 307 (10% solution in DEK) | 0.11 g |
| Solvent: (DEK/PGMEA 92/8 wt %) | 23.0 g |

Lithographic Printing Plate Precursor 1:

A two-layer, IR-sensitive, positive-working lithographic printing plate precursor was prepared by applying Inner Layer Formulation 1 to Substrate A using a 0.012 inch (0.030 cm) wire-wound bar and dried for 35 seconds at 120° C. to provide a dry coating weight of approximately 1.5 g/m². Outer Layer Formulation 1 was then applied over the dried inner layer using a 0.006 inch (0.030 cm) wire-wound bar and dried for 35 seconds at 120° C. to provide a dry coat weight of approximately 0.5 g/m².

Lithographic Printing Plate Precursor 2:

A two-layer, IR-sensitive, positive-working lithographic printing plate precursor was prepared by applying Inner Layer Formulation 2 to Substrate A using a 0.012 inch (0.030 cm) wire-wound bar and dried for 35 seconds at 120° C. to provide a dry coating weight of approximately 1.35 g/m². Outer Layer Formulation 2 was then applied to the dried inner layer using a 0.006 inch (0.030 cm) wire-wound bar and dried for 30 seconds at 120° C. to provide a dry coat weight of approximately 0.45 g/m².

Lithographic Printing Plate Precursor 3:

A two-layer, IR-sensitive, positive-working lithographic printing plate precursor was produced according to the following method:

Inner Layer Formulation 3 was applied to Substrate A using a laboratory hopper coater. The application rate was adjusted to provide a dry coat weight of 1.5 g/m². The coating was dried for 60 seconds at 70° C. Outer Layer Formulation 3 was applied with a hopper coater to provide a dry coat weight of 0.60 g/m² and dried at 65° C. for 60 seconds. Imageable Element 3 was subsequently dried again at 120° C. for 30 seconds.

Lithographic Printing Plate Precursor 4:

A two-layer, IR-sensitive, positive-working lithographic printing plate precursor was produced according to the following method:

Inner Layer Formulation 4 was applied to Substrate A using a laboratory hopper coater. The application rate was adjusted to provide a dry coat weight of 1.3 g/m$^2$. The coating was dried for 60 seconds at 70° C. Outer Layer Formulation 4 was applied with a hopper coater to provide a dry coat weight of 0.45 g/m$^2$ and dried at 65° C. for 60 seconds. Imageable Element 4 was subsequently dried again at 120° C. for 30 seconds.

Lithographic Printing Plate Precursor 5:

A two-layer, IR-sensitive, positive-working lithographic printing plate precursor was produced according to the following method:

Inner Layer Formulation 5 was applied to Substrate A using a 0.012 inch (0.030 cm) wire-wound bar and dried for 35 second at 120° C. to provide a dry coating weight of approximately 1.5 g/m$^2$. Outer Layer Formulation 5 was applied using a 0.006 inch (0.015 cm) wire-wound bar and dried for 35 seconds at 120° C. to provide a dry coat weight of approximately 0.6 g/m$^2$.

Invention Examples 1 and 2

Lithographic Printing Plate Precursors 1 and 2 were imaged using a Kodak Trendsetter 800 II Quantum platesetter. Internal test pattern "plot 0" was imaged at exposure energies of 69, 73, 78, 89, 96, 104, 113, 124, 138, and 155 mJ/cm$^2$ at a head power of 9 watts. The imaged precursors were hand developed using Gum M1 as a processing solution by applying it to the element surface for 20-30 seconds and then gently rubbing the surface with a soft gum-soaked pad until the imaged regions were clean of coating. The excess processing solution was wiped from the plate surface using a squeegee. The precursors were evaluated for development time, the exposure energy required to give a clean image, and the exposure energy required to give best image reproduction. The results are presented in the following TABLE I. The results indicate that both Lithographic Printing Plate Precursors 1 and 2 provided images in which one pixel (1 micrometer) lines and spaces were capable of being resolved.

Invention Examples 3 and 4

Lithographic Printing Plate Precursors 1 and 2 were imaged and processed according to the same procedure described for Invention Examples 1 and 2 except that Gum N1 was used as the processing solution. The results, shown in TABLE I above, were almost identical with Invention Examples 1 and 2. Slightly longer development time was required. Both Lithographic Printing Plate Precursors 1 and 2 provided images in which one pixel (10 micrometers) lines and spaces were capable of being resolved.

Invention Examples 5 and 6

Lithographic Printing Plate Precursors 1 and 2 were imaged on a Screen PTR4300. Internal test pattern C1 was applied at powers of 45-100% with increments of 5%. Drum speed was set to 1000 rpm. The imaged precursors were processed according to the same procedure as Invention Examples 1-2. The precursors were evaluated for development time, the exposure power required to give a clean image, and the exposure power required to give best image reproduction. The results are shown above in TABLE I. Those results show that it is possible to produce a high quality, simply-processable lithographic printing plate precursor with high exposure sensitivity. The high sensitivity of the precursor allows for maximum productivity because the Screen Platesetter can be run at maximum speed (1000 rpm).

Examples 7 and 8

Lithographic Printing Plate Precursors 1 and 2 were imaged using a Kodak Trendsetter 800 II Quantum platesetter. Internal test pattern "plot 12" was imaged across the whole elements at an exposure energy of 130 mJ/cm$^2$ at a head power of 9 watts. A 15 cm square was cut from the imaged region and placed in a tray and 100 ml of Gum N1 was used as the processing solution. The used processing solution was collected in a glass bottle. Initially, it was cloudy due to dispersed particles of removed outer layer. The bottles were placed on a roller and the time was recorded for the time ("clearing time") required for the processing solution to become clear. The results are shown in the following TABLE II.

TABLE I

| Invention Example | Precursor | Development time | Exposure (Cleanout) | Exposure (Best reproduction) | Comments |
|---|---|---|---|---|---|
| 1 | 1 | 20 seconds soak, 20 seconds gentle rub | 96 mJ/cm$^2$ | 124 mJ/cm$^2$ | Good image, high resolution, very easy to develop |
| 2 | 2 | 20 seconds soak, 40 seconds gentle rub | 96 mJ/cm$^2$ | 124 mJ/cm$^2$ | Good image, high resolution, easy to develop |
| 3 | 1 | 30 seconds soak, 30 seconds gentle rub | 96 mJ/cm$^2$ | 124 mJ/cm$^2$ | Good image, high resolution, easy to develop |
| 4 | 2 | 30 seconds soak, 30 seconds gentle rub | 96 mJ/cm$^2$ | 124 mJ/cm$^2$ | Good image, high resolution, easy to develop |
| 5 | 1 | 20 seconds soak, 20 second gentle rub | 70% power | 85% power | Good image, high resolution, easy to develop |
| 6 | 2 | 30 seconds soak, 30 seconds gentle rub | 65% power | 80% power | Good image, high resolution, easy to develop |

TABLE II

| Invention Example | Lithographic Printing Plate Precursor | Clearing Time |
|---|---|---|
| 7 | 1 | <10 minutes |
| 8 | 2 | 4-5 hours |

These data imply that one-step processing (or apparatus used for processing) of lithographic printing plate precursors according to this invention would not likely suffer from problems associated with sedimentation of insoluble coating particles.

Invention Examples 9 and 10

Lithographic Printing Plate Precursors 1 and 2 were imaged with a suitable test file using a Kodak Trendsetter 800 II Quantum platesetter at an exposure energy of 130 mJ/cm². The imaged precursors were processed using Gum N1 as the processing solution as described for Invention Examples 1 and 2. After excess processing solution was removed, the resulting lithographic printing plates were mounted directly on an A.B. Dick 9870 Duplicator Press (A.B. Dick, Niles, Ill.) that was charged with Van Son Rubber Base black Ink (Van Son Ink, Mineola, N.Y.). The aqueous fountain solution contained about 23.4 ml/liter (3 oz per gallon) Varn Litho Etch142W (Varn International, Addison, Ill.) and about 23.4 ml/liter (3 oz per gallon) Varn PAR (alcohol substitute) in water. The lithographic printing plates were wiped with a non-abrasive rag soaked with fountain solution. The printing press was started and the damping system was engaged to further wet the printing plates with fountain solution. After a few revolutions, the inking system was engaged and 200 copies were printed. The printed sheets were assessed for number of sheets needed to print a clean background, number of sheets to get to full ink density, and general image quality. The results, as shown below in TABLE III, indicate that processing according to the present invention using Gum N1 as the processing solution had no adverse effect on background cleanliness or image quality on the printed copies.

TABLE III

| Invention Example | Lithographic Printing Plate Precursor | Number of Sheets to Print Clean Background | Number of Sheets to Full Ink Density | Comments |
|---|---|---|---|---|
| 9 | 1 | 1 | 20 | Excellent image holding 1 pixel (10 micrometer dots) |
| 10 | 2 | 1 | 20 | Excellent image holding 1 pixel (10 micrometer dots) |

Invention Examples 11 and 12

Lithographic Printing Plate Precursors 1 and 2 were imaged with a suitable test file using a Kodak Trendsetter 800 II Quantum platesetter at an exposure energy of 120 mJ/cm². Imaged precursors were hand processed using Gum N1 as the processing solution. The processing solution was applied to the plate surface for 20-30 seconds and then the plate was gently rubbed with a soft processing solution-soaked pad until the imaged area was clean of coating. The excess processing solution was wiped from the plate surface using a squeegee.

The resulting lithographic printing plates were mounted on a Miehle sheet-fed press. Printing was performed using a wear ink containing 1.5% calcium carbonate and fountain solution containing Varn Litho Etch 142W (23.4 ml/liter) and PAR alcohol replacement (23.4 ml/liter). The plates were assessed for the following characteristics:

Start-up Blinding—At the start of the test, the number of printed impressions to get to full ink density was recorded Run Length—The number of impressions printed before solid and highlight wear was observed.

Chemical Resistance—At 5000 impressions, UV plate cleaner and Varn 120 plate cleaner were applied to different areas of the printing plate image. The chemicals were allowed to dry on the plate surface for 15 minutes before printing resumed. The number of printed impressions for the image to recover was recorded.

Overnight Hold—At the end of the workday, the printing plate was cleaned with aqua-image plate cleaner/preserver. The following morning, the printing plate was assessed for its ability to print relative to the previous evening.

The results are shown below in TABLE IV.

Invention Examples 13a-c

Lithographic Printing Plate Precursor 3 was imaged using a Kodak Trendsetter 80011 Quantum platesetter using internal test pattern 'plot 0'. Exposure strips were applied at a range of energies between 73 and 138 mJ/cm² at a head power of 9 watts. Exposed elements were passed through a Quartz Rinse/Gum unit that contained Gum N1 as the sole processing solution in both the rinse and gum sections of the machine. The temperatures of the processing solution in the rinse and gum sections were 30° C. and 23° C. respectively. The imaged precursors were processed at 1.5, 2.0, and 2.5 feet per minute (0.45, 0.61, and 0.76 m/min). The resulting lithographic printing plates were evaluated for the exposure energy required to give a clean image and the exposure energy required to give best image reproduction at each processing speed. The results shown below in TABLE V demonstrate that the precursor had low exposure requirements and provided good image quality when processed in a commercially available rinse/gum unit.

TABLE IV

| Invention Example | Precursor | Start up Blinding | Run length Solid wear | Run length Highlight Wear | Chemical Resistance | Overnight Hold |
|---|---|---|---|---|---|---|
| 11 | 1 | 25 sheets | 25,000 impressions | >25,000 impressions | <10 sheets | No problems |
| 12 | 2 | 20 sheets | 25,000 impressions | >25,000 impressions | <10 sheets | No problems |

TABLE V

| Invention Example | Precursor | Process Speed | Exposure - Cleanout | Exposure - Best Reproduction | Comments |
|---|---|---|---|---|---|
| 13a | 3 | 1.5 ft/min or 0.45 m/min | <73 mJ/cm$^2$ | 89 mJ/cm$^2$ | Very good image, good resolution |
| 13b | 3 | 2.0 ft/min or 0.61 m/min | <73 mJ/cm$^2$ | 113 mJ/cm$^2$ | Very good image, good resolution |
| 13c | 3 | 2.5 ft/min or 0.76 m/min | <73 mJ/cm$^2$ | 138 mJ/cm$^2$ | Very good image, good resolution |

Invention Examples 14a-b

Lithographic Printing Plate Precursor 4 was imaged using a Kodak Trendsetter 80011 Quantum platesetter using internal test pattern 'plot 0'. Exposure strips were applied at a range of energies between 73 and 138 mJ/cm$^2$ at a head power of 9 watts. Exposed precursors were passed through a Quartz Rinse/Gum unit that contained Gum N1 as the sole processing solution in both the rinse and gum sections of the machine. The temperatures of the processing solution in the rinse and gum sections were 30° C. and 23° C. respectively. The imaged precursors were processed at 1.0 and 1.5 feet per minute (0.30 and 0.45 m/min). The resulting lithographic printing plates were evaluated for the exposure energy required to give a clean image and the exposure energy required to give best image reproduction at each processing speed. The results shown below in TABLE VI demonstrate that the precursor had low exposure requirements and provided good image quality when processing using a commercially available rinse/gum unit.

TABLE VI

| Invention Example | Precursor | Process Speed | Exposure - Cleanout | Exposure - Best Reproduction | Comments |
|---|---|---|---|---|---|
| 14a | 4 | 1.0 ft/min or 0.30 m/min | <73 mJ/cm$^2$ | 138 mJ/cm$^2$ | Very good image, good resolution |
| 14b | 4 | 1.5 ft/min or 0.45 m/min | 104 mJ/cm$^2$ | 138 mJ/cm$^2$ | Very good image, good resolution |

Invention Example 15

Lithographic Printing Plate Precursor 1 was imaged using a Kodak Trendsetter 80011 Quantum platesetter using internal test pattern 'plot 0'. Exposures strips were applied at a range of energies between 69 and 155 mJ/cm$^2$ at a head power of 8 watts. The exposed precursor was processed in a dish containing Agfa Thermotect washout storage gum as the processing solution that was maintained at a temperature of 40° C. The imaged precursor was developed in about 60 seconds with light rubbing. The minimum exposure requirement to give a clean image was 78 mJ/cm$^2$ and the exposure energy required to produce best resolution was 113 mJ/cm$^2$.

Invention Example 16

Lithographic Printing Plate Precursor 2 was imaged using a Kodak Trendsetter 80011 Quantum platesetter using internal test pattern 'plot 0'. Exposures strips were applied at a range of energies between 69 and 155 mJ/m$^2$ at a head power of 8 watts. The exposed precursor was processed in a dish containing Agfa Thermotect washout storage gum as the processing solution that was maintained at a temperature of 40° C. The imaged precursor was developed within about 60 seconds with light rubbing. The minimum exposure requirement to give a clean image was 78 mJ/cm$^2$. The exposure energy required to produce best resolution was 104 mJ/cm$^2$.

Invention Example 17

Lithographic Printing Plate Precursor 3 was imaged using a Screen PTR4300 platesetter. Internal test pattern C1 was applied at an exposure power of 80% and a drum speed of 1000 rpm. The exposed precursor was processed in a dish using Agfa RC510 washout storage gum as the processing solution that was maintained at a temperature of 40° C. The imaged precursor was developed within about 120 seconds with light rubbing. A high-resolution image with excellent contrast was produced.

Invention Example 18

Lithographic Printing Plate Precursor 5 was imaged on a Screen PTR4300 platesetter using internal test pattern 'C1' at powers of 60-100% with increments of 5%, and a drum speed set to 1000 rpm. The imaged precursors were processed according to the same procedure as Invention Examples 1 and 2 except that Gum N1 gum was used as the processing solution. The precursors required an exposure power of 80% to be clean in the exposed areas and the best resolution occurred at an exposure of 90% power.

Lithographic Printing Plate Precursor 5 was cut into two strips that were placed in a Mathis Labdrier oven for 2 minutes at temperatures of 190° C. and 230° C. respectively. PE3-S image remover was applied to the surface of the baked precursors for 10 minutes and rinsed away with water. An estimation of the amount of coating removed by the image remover was then made. The precursor baked at 190° C. was considered mostly cured as the image remover had removed less than 20% of the coating. The precursor baked at 230° C. was fully cured and was not attacked by the image remover at all.

Invention Example 18 demonstrates that it is possible to produce a simple-processable lithographic printing plate precursor that is also fully bakeable at relatively low temperatures. For example, one can use a rinse/gum unit (such as a Quartz 850 R/G) in line (in combination) with a Kodak Quickbake oven to accomplish this combination of steps. The Quickbake oven uses less energy and has a smaller environmental footprint than conventional baking ovens. Baked precursors can withstand harsher press conditions and be used to print a larger number of impressions.

The invention has been described in detail with particular reference to certain preferred embodiments thereof, but it will be understood that variations and modifications can be effected within the spirit and scope of the invention.

The invention claimed is:

1. A method of making a lithographic printing plate ready for lithographic printing, the method consisting essentially of:
    A) imagewise exposing a positive-working lithographic printing plate precursor using infrared radiation to provide both exposed and non-exposed regions in said imaged precursor,
        said positive-working lithographic printing plate precursor comprising a substrate having thereon, in order:
        an inner layer comprising a first polymeric binder, and
        an ink receptive outer layer comprising a second polymeric binder that is different than said first polymeric binder,
        said positive-working lithographic printing plate precursor further comprising an infrared radiation absorbing compound,
    B) applying a single processing solution having a pH of from 6 to 11 to said imaged precursor both: (1) to remove predominantly only said exposed regions, and (2) to provide a protective coating over all of the exposed and non-exposed regions of the resulting lithographic printing plate, the single processing solution comprising a hydrophilic polymer to provide the protective coating, and
    C) removing excess processing solution from the resulting lithographic printing plate using a squeegee or nip rollers and optionally postbaking or curing the resulting lithographic printing plate,
    wherein the method is carried out without using a rinsing or gumming step after the single processing solution is applied.

2. The method of claim 1 wherein said single processing solution comprises at least 1 weight % of at least one anionic surfactant.

3. The method of claim 1 wherein said single processing solution consists essentially of from about 1 to about 45 weight % of one or more anionic surfactants.

4. The method of claim 1 wherein said single processing solution includes at least 0.001 weight % of an organic phosphonic acid or polycarboxylic acid, or a salt of either acid that is different than said one or more anionic surfactants.

5. The method of claim 4 wherein said single processing solution includes from about 0.001 to about 10 weight % of a salt of a polycarboxylic acid.

6. The method of claim 2 wherein at least one of said one or more anionic surfactants in said single processing solution has a sulfonic acid group or salt thereof that is present in an amount of from about 5 to about 45 weight %.

7. The method of claim 6 wherein at least one of said anionic surfactants in said single processing solution is an alkyldiphenyloxide disulfonate that is present in an amount of from about 8 to about 30 weight %.

8. The method of claim 1 wherein said single processing solution comprises two or more anionic surfactants, at least one of which is an alkyldiphenyloxide disulfonate.

9. The method of claim 8 wherein said single processing solution comprises two or more different anionic surfactants, at least one of which is an alkali alkyl naphthalene sulfonate that is present in an amount of from about 8 to about 20 weight %.

10. The method of claim 1 wherein said infrared radiation absorbing is an IR absorbing dye that is present predominantly in said inner layer in an amount of at least 3 weight %.

11. The method of claim 1 wherein said second polymeric binder is selected from one or more of the following groups consisting of polymer materials:
    Class a): novolak resins, resole resins, branched or unbranched polyhydroxystyrenes, polyvinyl acetals with pendant phenol groups, or any combination thereof,
    Class b): polymers having recurring units derived from one or more monomers of group (a) that is selected from the group consisting norbornene, tetracyclododecene, and mixtures thereof, and recurring units derived from one or more monomers of group (b) that is selected from the group consisting of maleic anhydride, maleimide, N-phenyl maleimide, N-benzyl maleimide, N-cyclohexyl maleimide, and mixtures thereof,
    Class c): copolymers derived from maleic anhydride and monomers of the formula $CH_2=CH(C_6H_4R^1)$ and mixtures thereof in which $R^1$ is hydrogen, halogen, hydroxyl, cyano, sulfonamide, alkyl of 1 to 6 carbon atoms, alkoxyl of 1 to 6 carbon atoms, acyl of 1 to 7 carbon atoms, acyloxy of 1 to 7 carbon atoms, carboalkoxy of 1 to 7 carbon atoms, or a mixture thereof,
    Class d): copolymers derived from methyl methacrylate and a carboxylic acid containing monomer or a mixture of carboxylic acid containing monomers,
    Class e): polymers having an —X—C(=T)—NR—S(=O)$_2$— moiety that is attached to the polymer backbone, wherein —X— is an oxy or —NR'— group, T is O or S, R and R' are independently hydrogen, halo, or an alkyl group having 1 to 6 carbon atoms, and
    Class f): polymers having recurring units represented by the following Structure (I-F) or (II-F):

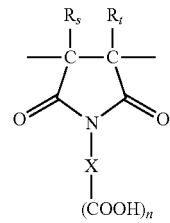

(I-F)

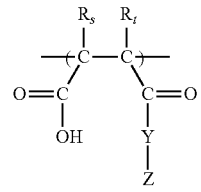

(II-F)

wherein n is 1 to 3, $R_s$ and $R_t$ are independently hydrogen or an alkyl or halo group, X is a multivalent linking group, Y is oxy or —NR— wherein R is hydrogen or an alkyl or aryl group, and Z is a monovalent organic group.

12. The method of claim 1 wherein said first polymeric binder is a (meth)acrylic acid resin, a poly(vinyl acetal), a maleated wood rosin, a vinyl acetate-crotonate-vinyl neodecanoate copolymer, a phenolic resin, a copolymer derived at least in part from styrene and maleic anhydride, a polymer derived at least in part from a (meth)acrylamide, a polymer derived at least in part from a (meth)acrylonitrile, a polymer derived at least in part from an N-substituted cyclic imide, a polymer derived at least in part from a (meth)acrylate having pendant hydroxy groups, a polymer having pendant cyclic urea groups, a polymer derived at least in part from an N-alkoxyalkyl methacrylamide, a polymer derived at least in part from styrene or a styrene derivative, a polymer derived at least in part from a phosphate (meth)acrylate ester, or a copolymer derived from an N-substituted cyclic imide, a (meth)acrylonitrile, a (meth)acrylamide, and a (meth)acrylic acid.

13. The method of claim 1 that provides a lithographic printing plate having a revealed hydrophilic substrate in said exposed regions.

14. The method of claim 1 wherein said single processing solution has a pH of from about 7 to about 10.5 and comprises at least one or more anionic surfactants that are present in a total amount of from about 5 to about 45 weight % and each has a sulfonic acid group or salt thereof.

15. The method of claim 1 wherein after step B), the printing plate is postbaked at from about 160 to about 220° C. for up to two minutes.

16. A method of lithographic printing consisting essentially of:
   A) imagewise exposing a positive-working lithographic printing plate precursor using infrared radiation to provide both exposed and non-exposed regions in said imaged precursor,
      said positive-working lithographic printing plate precursor comprising a substrate having thereon, in order:
      an inner layer comprising a first polymeric binder, and
      an ink receptive outer layer comprising a second polymeric binder that is different than said first polymeric binder,
      said positive-working lithographic printing plate precursor further comprising an infrared radiation absorbing compound,
   B) applying a single processing solution having a pH of from about 6 to about 11 to said imaged precursor both: (1) to remove predominantly only said exposed regions, and (2) to provide a protective coating over all of the exposed and non-exposed regions of the resulting lithographic printing plate,
   C) removing excess processing solution from said lithographic printing plate using a squeegee or nip rollers, and optionally postbaking, curing, or drying said lithographic printing plate, and
   D) without removing said protective coating and using a rinsing or gumming step after the single processing solution is applied, using said lithographic printing plate for printing an image using a lithographic printing ink.

17. The method of claim 16 wherein said single processing solution comprises at least 1 weight % of at least one anionic surfactant.

18. A method of making a lithographic printing plate ready for lithographic printing, the method consisting essentially of:
   A) imagewise exposing a positive-working lithographic printing plate precursor using infrared radiation to provide both exposed and non-exposed regions in said imaged precursor,
      said positive-working lithographic printing plate precursor comprising a substrate having thereon, in order:
      an inner layer comprising a first polymeric binder, and
      an ink receptive outer layer comprising a second polymeric binder that is different than said first polymeric binder,
      said positive-working lithographic printing plate precursor further comprising an infrared radiation absorbing compound,
   B) applying a single processing solution having a pH of from 6 to 11 to said imaged precursor both: (1) to remove predominantly only said exposed regions, and (2) to provide a protective coating over all of the exposed and non-exposed regions of the resulting lithographic printing plate, the single processing solution comprising a hydrophilic polymer to provide the protective coating, the single processing solution also comprising an alkyldiphosphenyloxide disulfonate in an amount of from about 8 weight % to about 30 weight %, and
   C) removing excess processing solution from the resulting lithographic printing plate, and optionally postbaking or curing the resulting lithographic printing plate,
   wherein the method is carried out without using a rinsing or gumming step after the single processing solution is applied.

* * * * *